(12) United States Patent
Laub

(10) Patent No.: US 11,185,191 B2
(45) Date of Patent: Nov. 30, 2021

(54) MODULAR FOOD HOLDING SYSTEM

(71) Applicant: PRINCE CASTLE LLC, Carol Stream, IL (US)

(72) Inventor: Christine Suen Laub, Roselle, IL (US)

(73) Assignee: Marmon Foodservice Technologies, Inc., Osseo, MN (US)

( * ) Notice: Subject to any disclaimer, the term of this patent is extended or adjusted under 35 U.S.C. 154(b) by 0 days.

(21) Appl. No.: 15/160,748

(22) Filed: May 20, 2016

(65) Prior Publication Data

US 2017/0332842 A1 Nov. 23, 2017

(51) Int. Cl.
| | |
|---|---|
| *A47J 39/00* | (2006.01) |
| *A47F 10/06* | (2006.01) |
| *H05K 5/02* | (2006.01) |
| *H05K 7/02* | (2006.01) |
| *A47B 87/02* | (2006.01) |
| *A47B 71/00* | (2006.01) |
| *A47B 77/08* | (2006.01) |
| *A47F 7/00* | (2006.01) |

(52) U.S. Cl.
CPC ............. *A47J 39/006* (2013.01); *A47F 10/06* (2013.01); *H05K 5/0217* (2013.01); *H05K 7/023* (2013.01); *A47B 71/00* (2013.01); *A47B 77/08* (2013.01); *A47B 87/0276* (2013.01); *A47F 7/0071* (2013.01)

(58) Field of Classification Search
CPC ........ A47J 39/02; A47J 39/006; H05K 7/023; H05K 5/0217; A47F 10/06; A47F 7/0071; A47B 77/08; A47B 71/00; A47B 87/0276; G05B 2219/25338; G05B 19/042

USPC .................................................. 219/394, 402
See application file for complete search history.

(56) References Cited

U.S. PATENT DOCUMENTS

| | | |
|---|---|---|
| D63,818 S | 1/1924 | Curtiss |
| 3,073,938 A | 1/1963 | Turner |
| D243,362 S | 2/1977 | Shumrak et al. |
| 4,349,147 A | 9/1982 | Jensen |

(Continued)

FOREIGN PATENT DOCUMENTS

| | | |
|---|---|---|
| AU | 2009290591 B2 | 10/2015 |
| CN | 202565936 U | 12/2012 |

(Continued)

OTHER PUBLICATIONS www.dictionary.com, definition of port (4 of 6), entry 4a. (Year: 2020).*

(Continued)

*Primary Examiner* — Jeffrey A Shapiro
(74) *Attorney, Agent, or Firm* — Andrus Intellectual Property Law, LLP

(57) ABSTRACT

A modular food holding system includes a plurality of individual modularized food holding chambers, each of the plurality of food holding chambers being physically and communicatively removably connected to one another. Each of the food holding chambers includes a food holding cavity and at least one of a heating element and/or a cooling element for heating or cooling the food holding cavity. A chamber base is physically and communicatively removably (Continued)

connected to one of the food holding chambers and operation of at least one food holding chamber is controlled by the chamber base.

20 Claims, 23 Drawing Sheets

(56) References Cited

U.S. PATENT DOCUMENTS

| | | | |
|---|---|---|---|
| 4,686,506 A * | 8/1987 | Farago | G06F 13/38 |
| | | | 341/100 |
| 4,760,921 A | 8/1988 | Licari | |
| 4,782,245 A * | 11/1988 | Henry | G06F 13/409 |
| | | | 307/112 |
| 4,864,274 A | 9/1989 | Black | |
| 5,253,564 A | 10/1993 | Rosenbrock et al. | |
| D341,054 S | 11/1993 | Maputol | |
| D364,530 S | 11/1995 | Robards, Jr. et al. | |
| D369,269 S | 4/1996 | Labadia Del Fresno | |
| 5,542,206 A | 8/1996 | Lisch | |
| 5,579,952 A | 12/1996 | Fiedler et al. | |
| 5,580,279 A * | 12/1996 | Belopolsky | H01R 13/6625 |
| | | | 439/620.09 |
| 5,628,653 A * | 5/1997 | Haas | H01R 31/005 |
| | | | 439/607.04 |
| 5,671,856 A | 9/1997 | Lisch | |
| 5,699,925 A | 12/1997 | Petruzzi | |
| 5,724,886 A | 3/1998 | Ewald et al. | |
| 5,729,431 A * | 3/1998 | Marwah | G06F 1/1601 |
| | | | 257/713 |
| 5,746,114 A | 5/1998 | Harris | |
| 5,783,803 A | 7/1998 | Robards, Jr. | |
| 5,828,905 A * | 10/1998 | Rao | G06F 3/002 |
| | | | 710/63 |
| 5,900,173 A | 5/1999 | Robards, Jr. | |
| 6,116,154 A | 9/2000 | Vaseloff | |
| D434,265 S | 11/2000 | Tatlow | |
| 6,175,099 B1 | 1/2001 | Shei et al. | |
| 6,198,084 B1 | 3/2001 | Kim | |
| 6,262,394 B1 | 7/2001 | Shei et al. | |
| 6,412,403 B1 | 7/2002 | Veltrop | |
| 6,459,175 B1 * | 10/2002 | Potega | B60L 11/185 |
| | | | 307/132 M |
| 6,545,587 B1 | 4/2003 | Hatakeyama et al. | |
| 6,587,739 B1 | 7/2003 | Abrams et al. | |
| 6,637,322 B2 | 10/2003 | Veltrop | |
| 6,658,994 B1 | 12/2003 | An | |
| 6,774,347 B2 | 8/2004 | Shon et al. | |
| 6,871,676 B2 | 3/2005 | Sus et al. | |
| 6,874,828 B2 | 4/2005 | Roatis et al. | |
| 6,878,391 B2 | 4/2005 | Veltrop | |
| 6,884,451 B2 | 4/2005 | Veltrop | |
| 6,924,467 B2 | 8/2005 | Ellis et al. | |
| 7,105,779 B2 | 9/2006 | Shei | |
| 7,128,582 B2 * | 10/2006 | Fang | H01R 13/514 |
| | | | 439/362 |
| 7,227,102 B2 | 6/2007 | Shei | |
| 7,328,654 B2 | 2/2008 | Shei | |
| 7,385,160 B2 | 6/2008 | Jones | |
| 7,407,392 B2 | 8/2008 | Cooke et al. | |
| 7,446,282 B2 | 11/2008 | Shei et al. | |
| 7,481,679 B1 * | 1/2009 | Stotz | H01R 12/7029 |
| | | | 439/638 |
| 7,510,096 B2 | 3/2009 | Wang | |
| 7,687,748 B2 | 3/2010 | Gagas | |
| 7,708,135 B2 | 5/2010 | Ellerth et al. | |
| 7,721,877 B2 | 5/2010 | Maine, Jr. et al. | |
| 7,762,636 B2 | 7/2010 | Veeser et al. | |
| 7,800,023 B2 | 9/2010 | Burtea et al. | |
| 7,858,906 B2 | 12/2010 | Veltrop et al. | |
| 7,905,173 B2 | 3/2011 | Sus et al. | |
| 7,975,840 B2 | 7/2011 | Messick, Jr. et al. | |
| 7,987,972 B2 | 8/2011 | Hennigar et al. | |
| 8,091,472 B2 | 1/2012 | Maciejewski et al. | |
| 8,096,231 B2 | 1/2012 | Veltrop et al. | |
| 8,506,687 B2 | 8/2013 | Jones | |
| 8,522,675 B2 | 9/2013 | Veltrop | |
| 8,607,587 B2 | 12/2013 | Veltrop | |
| 8,674,823 B1 * | 3/2014 | Contario | H02J 1/10 |
| | | | 340/333 |
| 8,810,417 B2 | 8/2014 | Hood et al. | |
| 8,813,960 B2 | 8/2014 | Fjelland | |
| D716,095 S | 10/2014 | Veltrop et al. | |
| D725,429 S * | 3/2015 | Veltrop | D7/323 |
| 8,997,636 B2 | 4/2015 | Kirby et al. | |
| 9,112,298 B1 | 8/2015 | Hayden et al. | |
| 9,140,484 B2 | 9/2015 | Veltrop | |
| 9,187,210 B2 | 11/2015 | Zhu et al. | |
| 9,221,611 B2 | 12/2015 | Ulchak et al. | |
| 9,504,318 B1 | 11/2016 | O'Keefe et al. | |
| 9,693,655 B2 | 7/2017 | Shei et al. | |
| 2001/0007322 A1 | 7/2001 | Shei et al. | |
| 2001/0038011 A1 | 11/2001 | Hillis | |
| 2003/0034898 A1 | 2/2003 | Shamoon et al. | |
| 2003/0118706 A1 | 6/2003 | Veltrop | |
| 2003/0169801 A1 | 9/2003 | Chilton | |
| 2004/0020915 A1 * | 2/2004 | Shei | A47J 39/006 |
| | | | 219/385 |
| 2004/0056761 A1 | 3/2004 | Vaseloff et al. | |
| 2005/0122656 A1 * | 6/2005 | Lee | G06F 1/1632 |
| | | | 361/118 |
| 2005/0211696 A1 | 9/2005 | Adamski | |
| 2006/0050184 A1 * | 3/2006 | McMiller | H04N 5/4401 |
| | | | 348/725 |
| 2006/0123174 A1 * | 6/2006 | Nguyen | G07F 17/32 |
| | | | 710/301 |
| 2006/0185527 A1 * | 8/2006 | Shei | A47J 39/006 |
| | | | 99/467 |
| 2007/0000905 A1 | 1/2007 | Imgram et al. | |
| 2007/0017245 A1 | 1/2007 | Song et al. | |
| 2007/0144202 A1 | 6/2007 | Theodos et al. | |
| 2007/0186570 A1 | 8/2007 | Kopf | |
| 2007/0236346 A1 | 10/2007 | Helal et al. | |
| 2008/0005395 A1 * | 1/2008 | Ong | G06F 13/385 |
| | | | 710/36 |
| 2008/0008795 A1 | 1/2008 | Thorneywork et al. | |
| 2008/0023462 A1 * | 1/2008 | Shei | A47J 39/006 |
| | | | 219/394 |
| 2008/0156009 A1 | 7/2008 | Cur et al. | |
| 2008/0156030 A1 | 7/2008 | Cur et al. | |
| 2008/0283440 A1 | 11/2008 | Hartsfield, Jr. et al. | |
| 2008/0302778 A1 | 12/2008 | Veltrop et al. | |
| 2009/0126580 A1 | 5/2009 | Hartfelder et al. | |
| 2009/0199723 A1 | 8/2009 | Veltrop et al. | |
| 2009/0199725 A1 * | 8/2009 | Veltrop | A47J 37/0623 |
| | | | 99/483 |
| 2009/0252842 A1 | 10/2009 | Wang et al. | |
| 2009/0266244 A1 | 10/2009 | Maciejewski et al. | |
| 2010/0025267 A1 * | 2/2010 | Brand | A47G 19/2227 |
| | | | 206/216 |
| 2010/0101254 A1 | 4/2010 | Besore et al. | |
| 2010/0162747 A1 | 7/2010 | Hamel et al. | |
| 2010/0186600 A1 | 7/2010 | Lewis et al. | |
| 2010/0191474 A1 | 7/2010 | Haick | |
| 2010/0192609 A1 | 8/2010 | Chae et al. | |
| 2010/0275789 A1 | 11/2010 | Lee et al. | |
| 2010/0307188 A1 | 12/2010 | Kwon et al. | |
| 2010/0326286 A1 | 12/2010 | Romero et al. | |
| 2011/0011109 A1 | 1/2011 | Rafalovich et al. | |
| 2011/0030565 A1 | 2/2011 | Shei | |
| 2011/0239675 A1 | 10/2011 | Roekens | |
| 2011/0253698 A1 | 10/2011 | Theodos et al. | |
| 2011/0253703 A1 | 10/2011 | Theodos et al. | |
| 2011/0283714 A1 | 11/2011 | Veltrop | |
| 2011/0283895 A1 | 11/2011 | Veltrop | |
| 2012/0023987 A1 | 2/2012 | Besore et al. | |
| 2012/0079699 A1 | 4/2012 | Veltrop et al. | |
| 2013/0055002 A1 * | 2/2013 | Brooks | G06F 1/266 |
| | | | 713/340 |
| 2013/0125193 A1 * | 5/2013 | Wells | H04N 7/17309 |
| | | | 725/127 |

(56) References Cited

U.S. PATENT DOCUMENTS

| | | | |
|---|---|---|---|
| 2013/0242497 A1* | 9/2013 | Lin | H01R 31/065 361/679.32 |
| 2013/0277353 A1 | 10/2013 | Joseph et al. | |
| 2014/0136749 A1* | 5/2014 | North | G06F 13/4022 710/313 |
| 2014/0150461 A1 | 6/2014 | Veltrop | |
| 2014/0231406 A1* | 8/2014 | Tsang | A61M 5/44 219/394 |
| 2014/0263269 A1* | 9/2014 | Veltrop | F24C 7/043 219/394 |
| 2014/0345474 A1 | 11/2014 | Trench Rocha et al. | |
| 2015/0129395 A1 | 5/2015 | Messick, Jr. | |
| 2015/0151919 A1 | 6/2015 | Messick, Jr. et al. | |
| 2015/0191312 A1 | 7/2015 | Ulchak et al. | |
| 2015/0327726 A1 | 11/2015 | Betzod et al. | |
| 2015/0338917 A1* | 11/2015 | Steiner | H04L 9/3231 345/156 |
| 2016/0176568 A1 | 6/2016 | Glasgow et al. | |
| 2016/0185529 A1 | 6/2016 | Bauer | |
| 2016/0185530 A1 | 6/2016 | Malkowski et al. | |
| 2016/0204711 A1* | 7/2016 | Morrow | H02M 7/06 363/126 |
| 2016/0296012 A1* | 10/2016 | Ciccacci | A47B 77/08 |
| 2017/0071408 A1 | 3/2017 | Veltrop et al. | |
| 2017/0071409 A1 | 3/2017 | Veltrop | |
| 2017/0071410 A1 | 3/2017 | Veltrop et al. | |
| 2017/0071411 A1 | 3/2017 | Veltrop et al. | |
| 2017/0071412 A1 | 3/2017 | Veltrop et al. | |
| 2017/0150843 A1 | 6/2017 | Rosalia et al. | |
| 2017/0324576 A1* | 11/2017 | Jain | G06F 9/50 |

FOREIGN PATENT DOCUMENTS

| | | |
|---|---|---|
| CN | 204189001 U | 3/2015 |
| CN | 206440961 U | 8/2017 |
| WO | WO-2013062832 A1 | 5/2013 |

OTHER PUBLICATIONS

"Modular Holding Cabinets", Product Catalog, Carter-Hoffmann, Mundelein, Illinois (Jan. 2014).

U.S. Appl. No. 14/850,914, Notice of Allowance, dated Oct. 16, 2017.

U.S. Appl. No. 14/850,921, Nonfinal Office Action, dated Aug. 23, 2017.

U.S. Appl. No. 14/850,930, Nonfinal Office Action, dated Sep. 1, 2017.

U.S. Appl. No. 14/850,937, Nonfinal Office Action, dated Sep. 13, 2017.

U.S. Appl. No. 14/850,914, Nonfinal Office Action, dated Feb. 23, 2017.

U.S. Appl. No. 14/850,944, Nonfinal Office Action, dated Jul. 6, 2017.

First Office Action for Chinese Patent Application No. 201610812668. 5, dated Jan. 25, 2021.

* cited by examiner

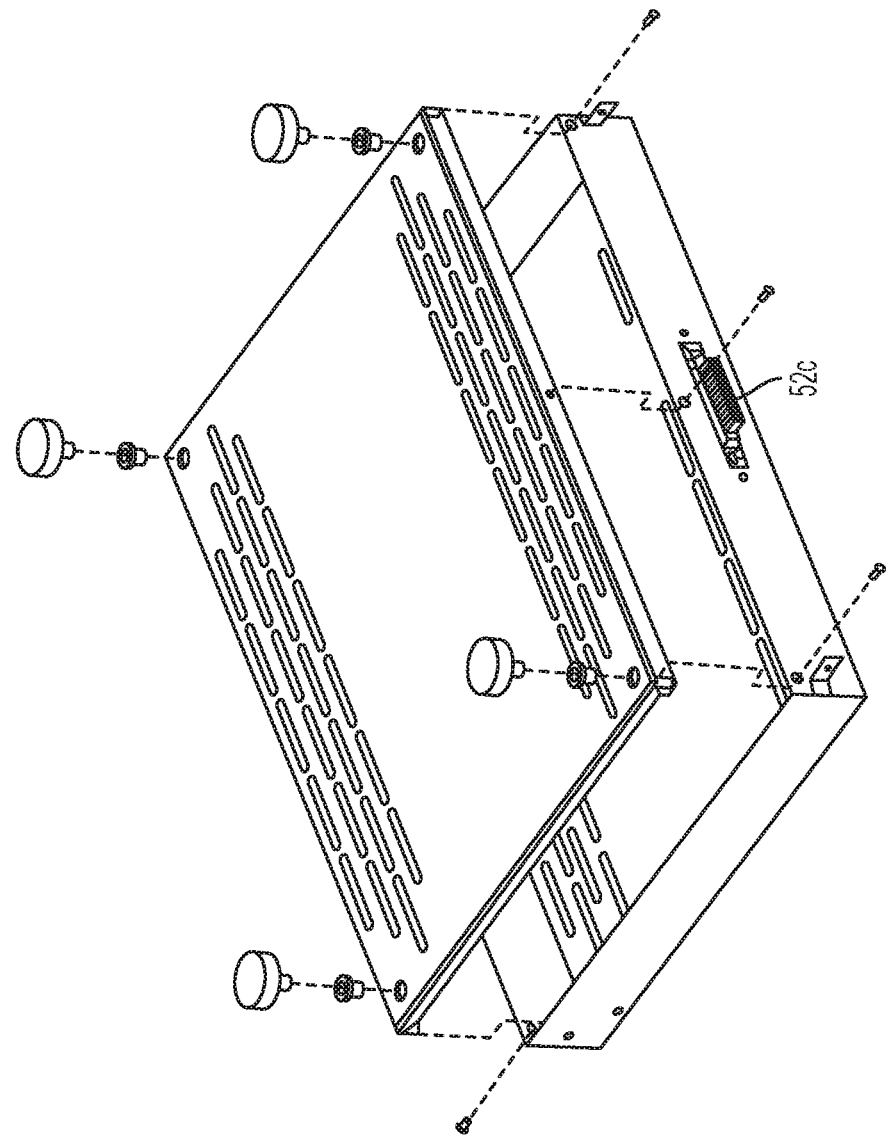

MODULAR FOOD HOLDING SYSTEM

FIELD OF THE INVENTION

The invention relates generally to food holding systems and more specifically to reconfigurable modular food holding systems.

BACKGROUND OF THE INVENTION

Restaurant success often depends on how quickly customers can be served with food items that a customer orders and on the quality of the food items when served. If the rate at which a restaurant prepares food items equals the rate at which those same food items are ordered and sold, a restaurant can theoretically have freshly-prepared food items ready to serve as customers order food items. Since it is not always possible to match food item production with customer ordering rates, and since certain fast food restaurant customers expect to receive their ordered food items quickly, many quick service food restaurants prepare various food items before customers order and keep food items ready for sale until a customer arrives and orders a prepared food item.

Holding systems to keep prepared food items ready for sale allow a cooked or ready-to-consume food item to be put into the system (e.g., an oven or a refrigerator) from one side and to be taken from the system on the opposite side thereby allowing food preparers to add food to the system and food servers to take food from the system.

Current holding systems come in various fixed sizes but the holding systems are not reconfigurable. Rather, such current holding systems are typically purchased "off the shelf" from a manufacturer/retailer or are custom designed to meet a specific user's specific needs. Regardless, current holding systems are "fixed" and thus not reconfigurable. Such fixed dimensional holding units limit food preparation layouts which may have to be modified or altered, for numerous reasons, relatively frequently. For example, as quick serve restaurants add or change menus items, food preparation layouts may need to be adjusted. Additionally, different configurations may be desirable to facilitate increased production of different menu items at different times, for example, different menu items and holding capabilities may be desirable at breakfast than at lunch or dinner. Fixed dimensional holding systems limit the degree to which the food preparation layouts may be reconfigured.

Moreover, after remodeling a kitchen, existing fixed holding systems may not be properly sized for the reconfigured kitchen. This may lead to the purchase of new food holding systems at considerable expense or to undesirable or inefficient food preparation layout.

Generally speaking, food holding systems in the restaurant industry should be easy to operate, for example, because of the high turnover of personnel, which often requires frequent training of new personnel. Thus, it would be beneficial to provide a more flexible, reconfigurable, and easy to operate food holding system.

SUMMARY

In one aspect, a modular food holding system includes a master base configured to communicatively connect each of one or more food holding chambers to a central controller, a first food holding chamber directly connected to the master base, the first food holding chamber having a first chamber body, and a second food holding chamber connected to the master base through either (i) the first food holding chamber or (ii) an expansion base connected to the master base, the second food holding chamber having a second chamber body. The first food holding chamber has a first chamber upstream power and communications port located on a bottom surface of the first chamber housing and a first chamber downstream power and communications port located on a top surface of the first chamber housing. The second food holding chamber has a second upstream power and communications port located on a bottom surface of the second chamber housing and a second chamber downstream power and communications port located on a top surface of the second chamber housing.

The modular food holding system may include one or more of the following preferred forms.

In some forms, the food holding cavity may include one of a blind cavity and a through cavity.

In other forms, the first food holding chamber may include a first alignment structure on the bottom surface of the first chamber housing.

In yet other preferred forms, the second food holding chamber may include a second alignment structure on the top surface of the second chamber housing, the second alignment structure cooperating with the first alignment structure to align the first food holding chamber with the second food holding chamber when the first and second food holding chambers are stacked to form a food holding unit.

In yet other preferred forms, the first alignment structure may be a post that extends away from the bottom surface of the first chamber housing and the second alignment structure may a hole.

In yet other preferred forms, the post may extend away from the bottom surface of the first chamber housing a greater distance than the first power and communications port.

In yet other preferred forms, the first food holding chamber may include a first securing mechanism on the bottom surface of the first chamber housing and the second food holding chamber may include a second securing structure on the top surface of the second chamber housing.

In yet other preferred forms, the first securing mechanism may be a bracket and the second securing mechanism may be an opening.

In yet other preferred forms, the first food holding chamber may include a power safety adapter that is operatively connected to the first upstream power and communications port.

In other aspects, methods and systems for monitoring and controlling a modular food holding system are disclosed herein. The modular food holding system may include a master base communicatively connected to a plurality of food holding chambers and to a central controller, such that the central controller communicates with the food holding chambers through the master base. The food holding chambers may be identical or functionally identical, and some food holding chambers may connect to the master base through other food holding chambers or expansion bases. Each food holding chamber may include an upstream connection and a downstream connection, each having a power connection and a communication connection. In some embodiments, the master base may be incorporated into one of the modular food holding chambers.

BRIEF DESCRIPTION OF THE DRAWINGS

FIG. 30 is a bottom perspective and exploded view of the expansion base of FIG. 26.

DETAILED DESCRIPTION

Although the following text sets forth a detailed description of particular embodiments, the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

Unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112(f).

As used herein, the term "food holding system" is hereby defined to mean any system that is capable of holding food in a fully or partially prepared state and ready for immediate sale, consumption, or use. The term "food holding system" is further defined to include, without limitation, hot and cold food holding systems, such as, for example, ovens, toasters, radiant heaters, refrigerators, freezers, or any other type of heating or cooling device. Furthermore, the term "food holding system" is also defined to include, without limitation, passive temperature control devices such as insulated compartments.

As used herein, the term "communicatively" is hereby defined to mean that two elements are connected in such a way to enable communications to be passed from one element to another. The term "communicatively" is further defined to include, without limitation, electronic connections, such as wired or wireless connection, mechanical connections, pneumatic connections, hydraulic connection, or any other type of connection that allows communication signals to be passed between elements. The communication signals may include command and control signals, such as instructions, and the communication signals may include data transmissions, such as sensor data.

Figure 1:
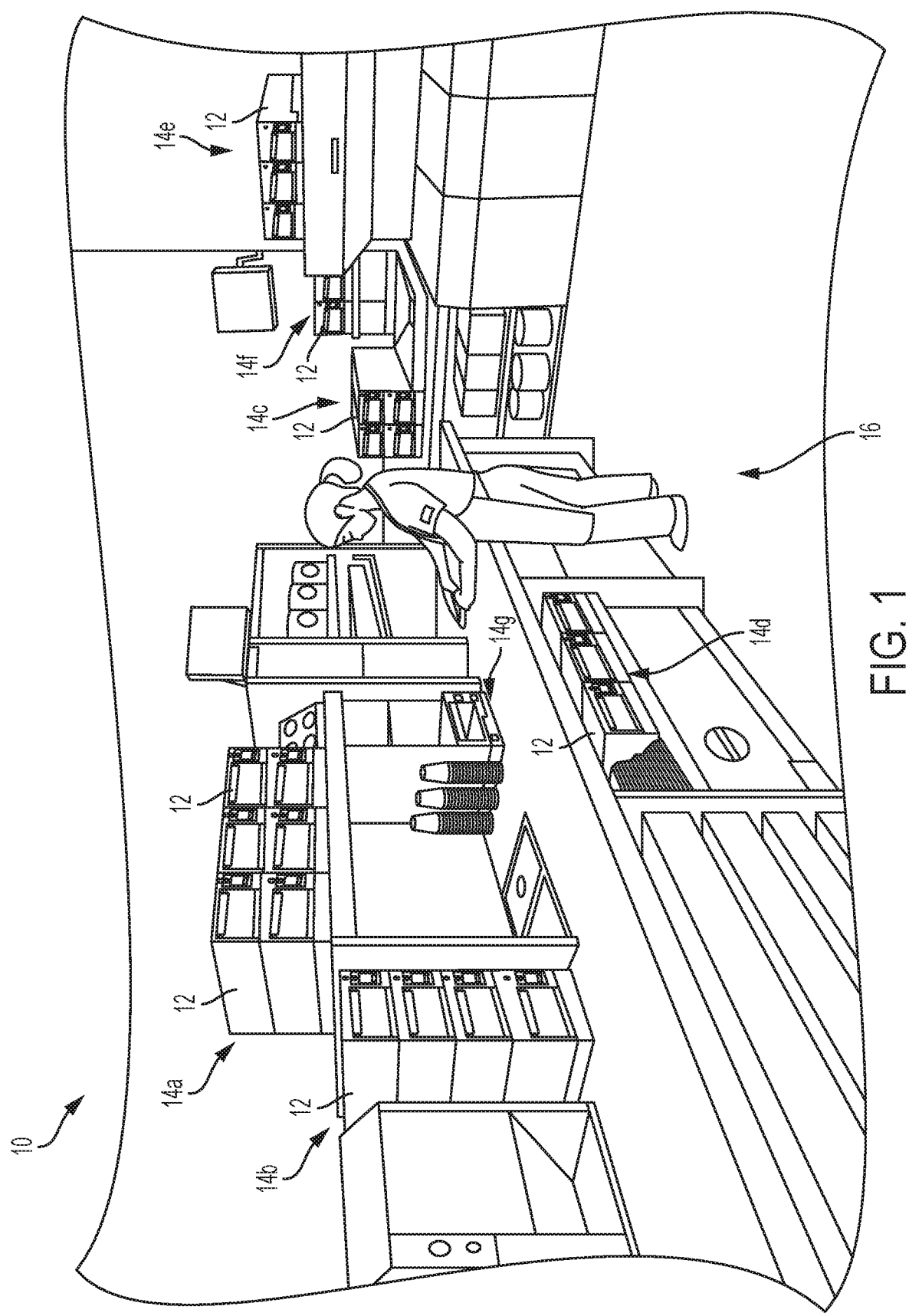
FIG. 1 is a perspective view of a modular food holding system.

Turning now to FIG. 1, a modular food holding system 10 is illustrated that is constructed in accordance with the teachings of the disclosure. The modular food holding system 10 comprises a plurality of individual modularized food holding chambers 12. Two or more of the individual modularized food holding chambers 12 may be physically and communicatively connected with one another to form various food holding stations or food holding units 14. The food holding units 14 may be configured to optimize food holding capacity for a given area in the food preparation area, such as a kitchen 16. Where more capacity is needed, more individual modularized food holding chambers 12 may be connected together. For example, six individual food holding chambers 12 may be connected to form a 3×2 food holding unit 14a in a food preparation area. Similarly, four individual food holding chambers 12 may be connected to form a 4×1 food holding unit 14b near a toaster or to form a 2×2 food holding unit 14c near a fryer or grill station. Likewise, three individual food holding chambers 12 may be connected to form a 3×1 food holding unit 14d, 14e, under a preparation counter or over a fryer or grill, respectively. Along the same lines, two individual food holding chambers 12 may be connected to form a 2×1 food holding unit 14f above a salt station. Alternatively, a single individual food holding chamber 12 may form a food holding unit 14g, near a food preparation area. Each of the above identified food holding unit configurations is exemplary only and any number of individual food holding chambers 12 may be connected to form each food holding unit 14, depending on user needs.

Figure 2:
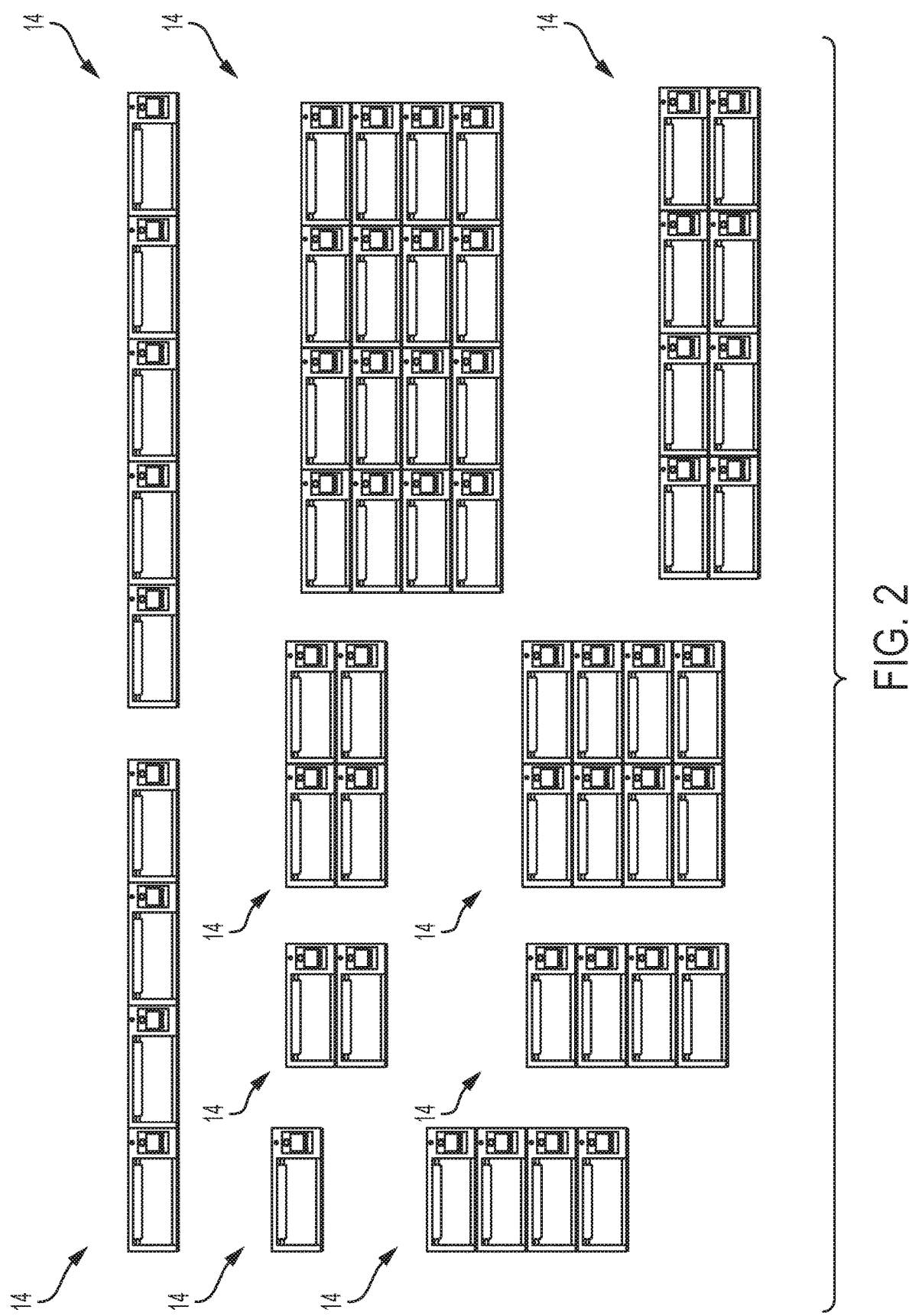
FIG. 2 is a plan view of the modular food holding system of FIG. 1 forming a plurality of reconfigurable modular chambers.

FIG. 2 illustrates additional exemplary configurations for the food holding units 14, anywhere between 1×1 to 4×4. Again, the configurations illustrated in FIG. 2 are intended to be exemplary only and are not intended to limit the food holding units 14 to the illustrated configurations. Furthermore, the food holding units 14 illustrated in FIG. 2 demonstrate the great flexibility of the food holding system 10 described herein. Some of the advantages to the disclosed food holding system 10 include configuration flexibility (due to the modular nature of the individual food holding chambers), ease of reconfiguration (which will be described further hereinafter), economy of space, and ease of operation.

Figure 3:
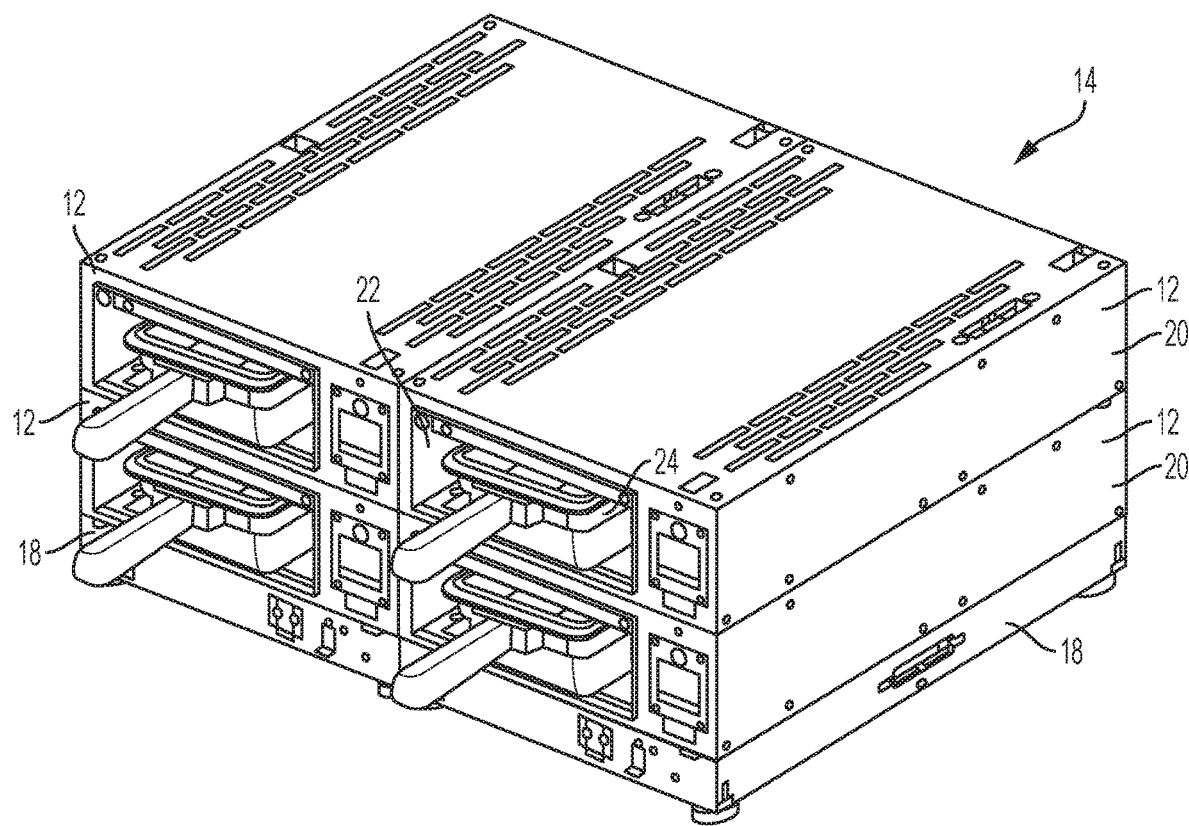
FIG. 3 is a close-up perspective view of the modular food holding system of FIG. 1 in a 2×2 configuration.
Figure 4:
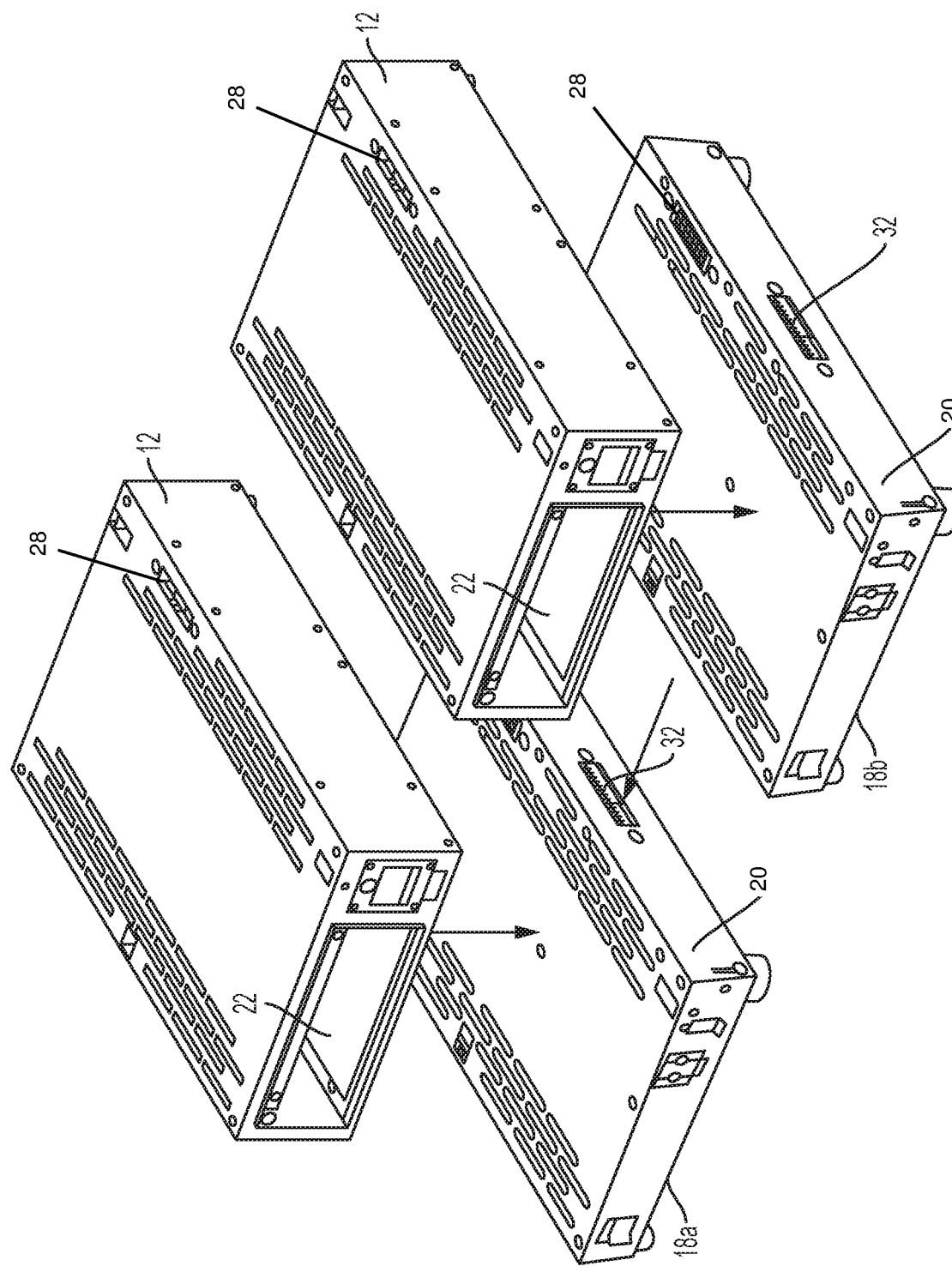
FIG. 4 is an exploded perspective view of two chambers of the modular food holding system of FIG. 1, including a master base and an expansion base.
Figure 5:
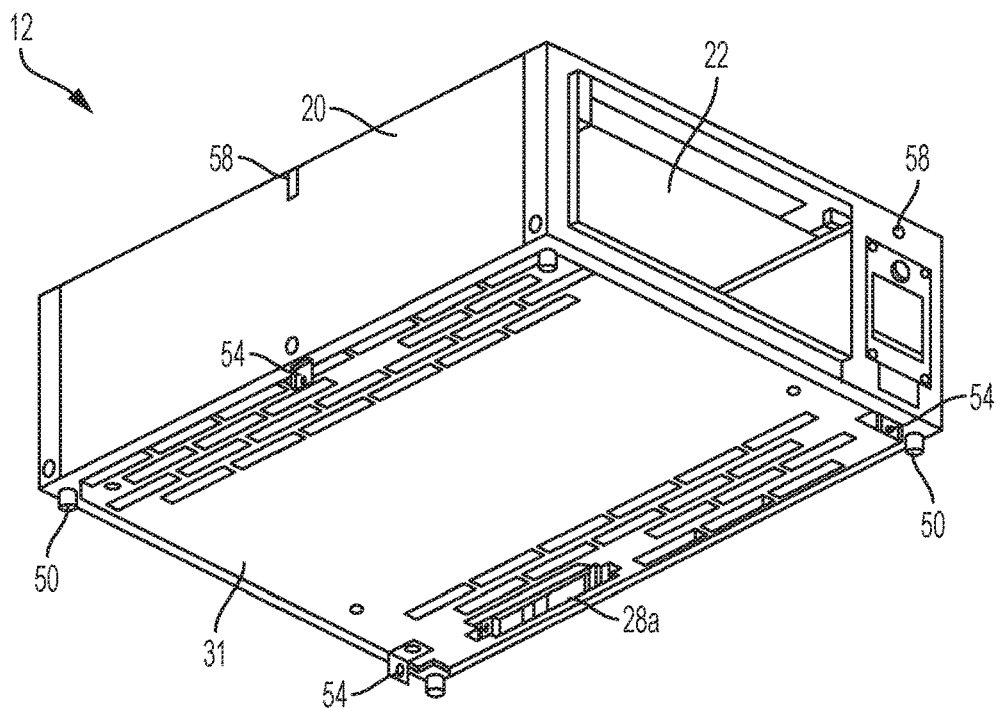
FIG. 5 is a bottom perspective view of one of the chambers of FIG. 4.
Figure 6:
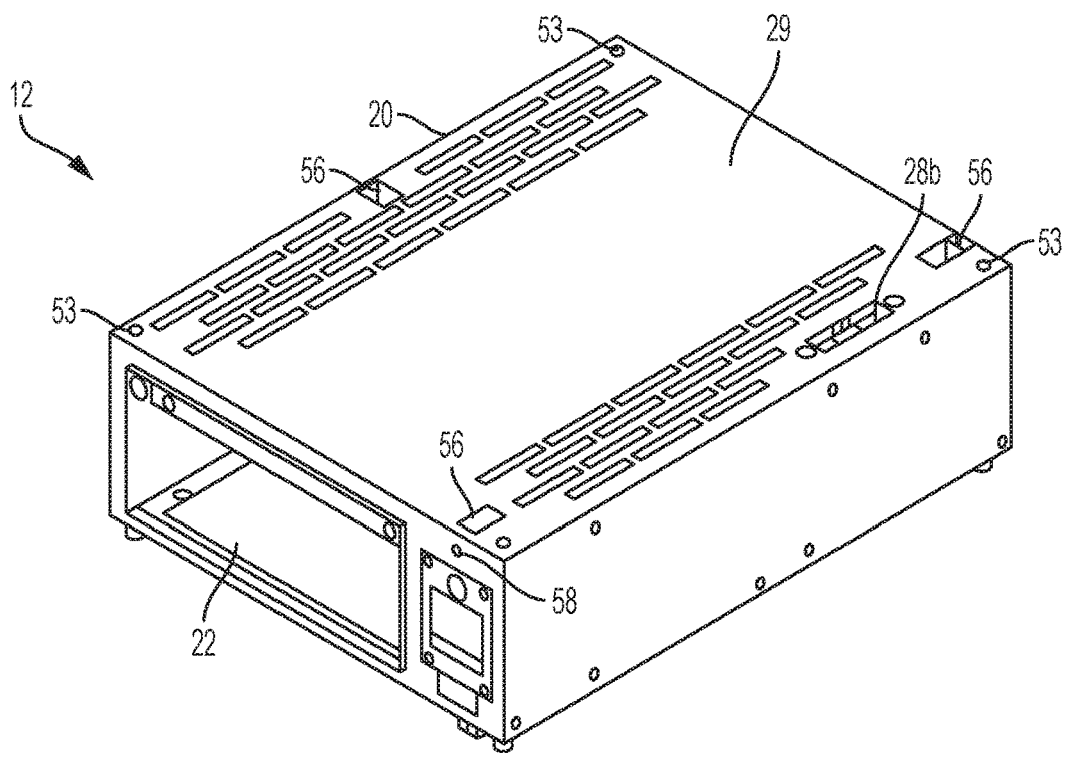
FIG. 6 is a top perspective view of the chamber of FIG. 5.
Figure 8:
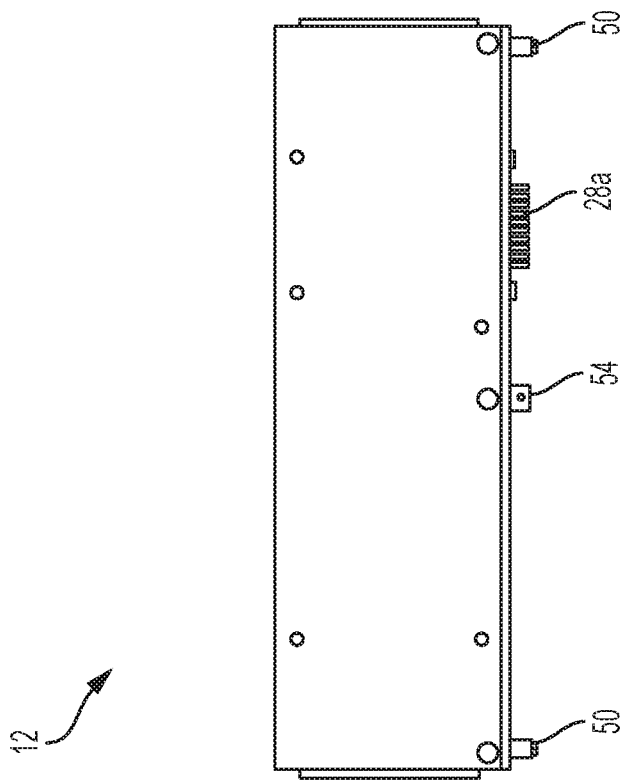
FIG. 8 is a side plan view of the chamber of FIG. 5.
Figure 7:
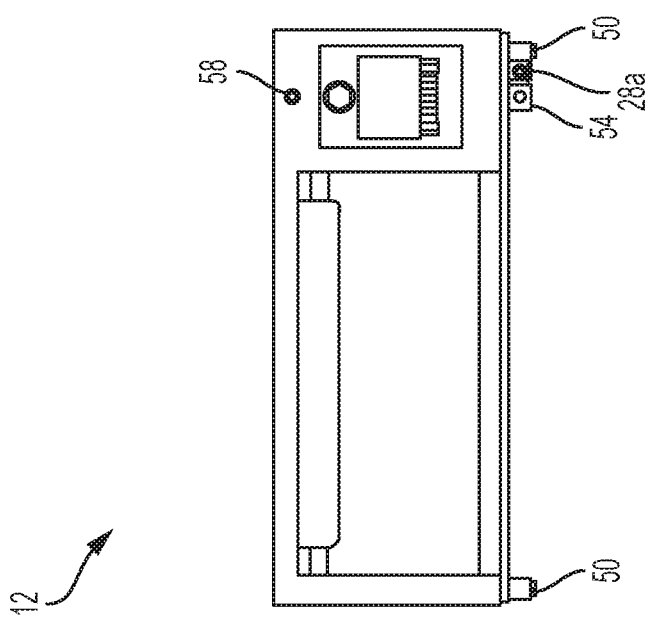
FIG. 7 is a front plan view of the chamber of FIG. 5.

Each food holding unit 14 includes one or more individual food holding chambers 12 and one or more chamber bases 18, as illustrated in FIGS. 3-30. Turning more specifically to FIGS. 3 and 4, each chamber base 18 is physically removably connected to one individual food holding chamber 12. Additionally, the chamber bases 18 may be connected to one another to provide passage of power and/or communication instructions from one chamber base 18 to another chamber base 18 and/or to one or more individual food holding chambers 12. Each individual food holding chamber 12 includes a chamber housing 20 that includes a chamber cavity 22. The chamber cavity 22 may be formed as a blind cavity (having a single opening and an end wall), or as a through cavity (having an opening at either end). Regardless, each chamber cavity 22 is sized and shaped to receive a food holding tray 24. The food holding tray 24 may contain one or more food items that are to be maintained in holding conditions (e.g., temperature, humidity, etc.), until the food item is sold. Each individual food holding chamber 12 may include one or more chamber power and communications ports 28 in the chamber housing 20. The chamber power and communications ports 28 facilitate transfer of power and communications between individual food holding chambers 12 and/or between an individual food holding chamber 12 and a chamber base 18. Alternatively, or in addition to the chamber power and communications port 28, the chamber base 18 may include separate power ports and separate communication ports.

Optionally, one chamber base 18 may function as a master base 18a and the other chamber bases 18 in a food holding unit 14 may function as expansion bases 18b. The master base 18a may include connectivity to a controller of some sort, for example a touch screen controller or other communicatively connected controlling device. The expansion bases 18b then function as conduits for power and communications from the master base 18a to individual food holding chambers 12.

Referring now to FIGS. 5-16, an exemplary food holding chamber 12 includes upstream and downstream connections. "Upstream" and "downstream" in this application are used in the context of the direction of flow of power and/or communications. Generally, power and communication flow first from the master base (e.g., the most upstream component) to the food holding chambers 12 and/or to the expansion bases (e.g., downstream components). Additionally, the food holding chambers 12 are always downstream of a master base 18a and in some cases may be downstream of an expansion base 18b, while the expansion bases 18b are downstream of the master base 18a and upstream of certain food holding chambers 12 at the same time. Additionally, a particular food holding chamber 12 may be downstream of some food holding chambers 12 and upstream of other food holding chambers 12 in a given configuration.

The upstream and downstream connections are configured in such a way that a downstream food holding chamber 12 automatically connects to the upstream food holding chamber 12 (or to a base 18) when physically connected forming a food holding unit 14, as discussed elsewhere herein. In the illustrated embodiment, the downstream connections are disposed in a top surface 29 of the chamber housing 20, and the upstream connections are disposed in a corresponding location in a bottom surface 31 of the chamber housing 20. The exemplary upstream and downstream connections include an upstream power and communication connection by an upstream power and communication port 28a (shown in this embodiment as a MOLEX® BMC connector) and a downstream power and communication connection by a downstream power and communication port 28b (shown in this embodiment as a MOLEX® BMC connector). While the upstream power and communication port 28a is illustrated as a male portion of the BMC connector and the downstream power and communication port 28b is illustrated as a female portion of the BMC connector, the male/female portions could be reversed in other embodiments. Furthermore, other embodiments may include other types of power and communication ports, so long as the port is capable of transmitting power and communication information from one chamber 12 to another chamber and/or from a base 18 to a chamber 12. In yet other embodiments, the power and communication port may be split into separate power and communication ports.

When a downstream food holding chamber 12 is stacked atop an upstream food holding chamber 12 and moved into place, the upstream connection is inserted into the downstream connection (e.g., the upstream power and communication port 28a of the upper food holding chamber 12 is joined to the downstream power and communication port 28b of the lower food holding chamber), thereby connecting the downstream (or upper) food holding chamber 12 to the master base 18 through the upstream (or lower) food holding chamber 12.

Referring now to FIGS. 17-23, the master base 18a in the exemplary modular food holding system 10 may include chamber power and communications connections as the chamber power and communications port 32a (shown in this embodiment as a MOLEX® BMC connector) disposed at a corresponding location in a top surface 40 of a master base housing 42 to connect to a food holding chamber 12.

Similarly, the master base 18a in the exemplary modular food holding system 100 may include expansion power and communications connections as the expansion power and communications port 32b (shown in this embodiment as a MOLEX® BMC connector) disposed at a corresponding location in a side surface 46 of the base housing 42 to connect to an expansion base 18b. Other embodiments may include other types of power and communication ports, so long as the port is capable of transmitting power and communication information from the master base 18a to a food holding chamber 12 and/or from the master base 18a to an expansion base 18b.

Referring now to FIGS. 26-30, the expansion base 18b in the exemplary modular food holding system 10 may include chamber power and communications connections as the chamber power and communications port 52a (shown in this embodiment as a MOLEX® BMC connector) disposed at a corresponding location in a top surface 65 of an expansion base housing 42 to connect to a food holding chamber 12. Similarly, the expansion base 18b in the exemplary modular food holding system 100 may include expansion power and communications connections as the expansion power and communications port 52b (shown in this embodiment as a MOLEX® BMC connector) disposed at a corresponding location in a first side surface 66 of the base housing 62 to connect to a subsequent expansion base 18b. The expansion base 18b also includes a master power and communications connection as the master power and communications port 52c (shown in this example as a MOLEX® BMC connector) disposed at a corresponding location in a second side surface 68 of the expansion base housing 62, opposite the first side surface 66. The master power and communications port 52c is used to connect the expansion base 18b to the master base 18a. Other embodiments may include other types of power and communication ports, so long as the port is capable of transmitting power and communication information from the expansion base 18a to a food holding chamber 12 and/or from the expansion base 18b to another expansion base 18b.

Returning now to FIGS. 5-16, the food holding chamber 12 will be described in more detail. As discussed above, the food holding chamber 12 includes a chamber housing 20. A plurality of alignment mechanisms, such as posts 50, extend from the bottom surface 31 of the chamber housing 20. The posts 50 are sized and shaped to be received within a complementary alignment mechanism, such as holes 53, that are formed in the top surface 29 of the chamber housing 20. When stacking a first food holding chamber 12 on top of a second food holding chamber 12, the alignment mechanisms center and stabilize the first food holding chamber 12 on top of the second food holding chamber 12 to form a food holding unit 14 (FIGS. 1 and 2). In the illustrated embodiment, the posts 50 and holes 53 are located near outer corners of the bottom surface 31 and of the top surface 29, respectively. In other embodiments, the alignment mechanisms may be formed at other locations on the bottom surface 31 and on the top surface 29. In yet other embodiments, the posts 50 and the holes 53 could be reversed.

Additionally, a plurality of securing mechanisms, such as brackets 54, extend from the bottom surface 31 of the chamber housing 20. The brackets 54 are sized and shaped to be received by a plurality of complementary securing mechanisms, such as openings 56 formed in the top surface 29 of the chamber housing 20. In other embodiments, the brackets 54 and the openings 56 could be reversed.

The posts 50 extend away from the bottom surface 31 a greater distance than the upstream power and communications port 28a. The posts 50 also extend away from the bottom surface 31 a greater distance than the brackets 54. The posts 50 extend farther to ensure proper alignment of the upstream power and communications port 28a of the first food holding chamber 12 with the downstream power and communications port 28b of the second food holding chamber 12 when food holding chambers 12 are stacked to form a food holding unit 14. Because the posts 50 align respective food holding chambers 12 before engagement of the upstream and downstream power and communications ports 28a, 28b, damage to the upstream and downstream power and communications ports 28a, 28b due to misalignment is reduced or eliminated. Similarly, damage to brackets 54 and the openings 56 due to misalignment is reduced or eliminated. Once the bracket 54 is fully seated within the opening 56, the two food holding chambers 12 may be further secured to one another by inserting a fastener, such as a screw, through a hole 58 in a surface adjacent to the opening 56 (e.g., a front or side surface of the chamber housing 20) and into the bracket 54.

Figure 10:
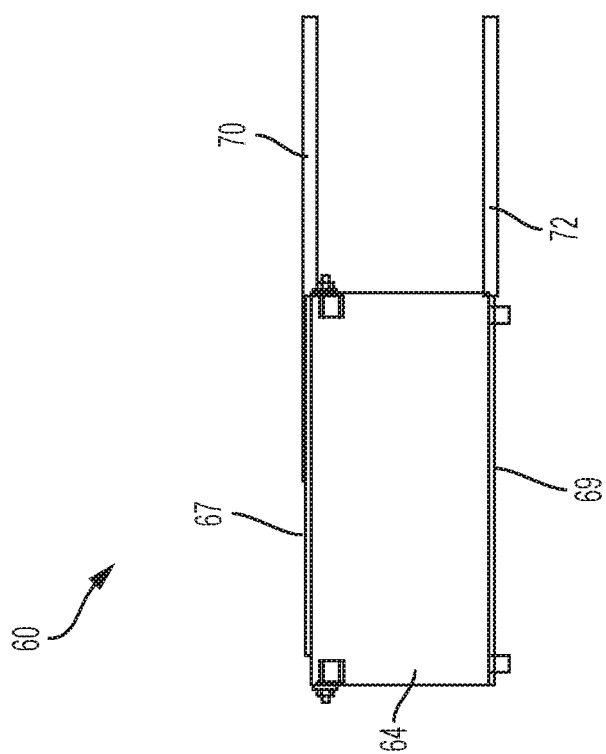
FIG. 10 is a side view of the heater tunnel of FIG. 9.
Figure 9:
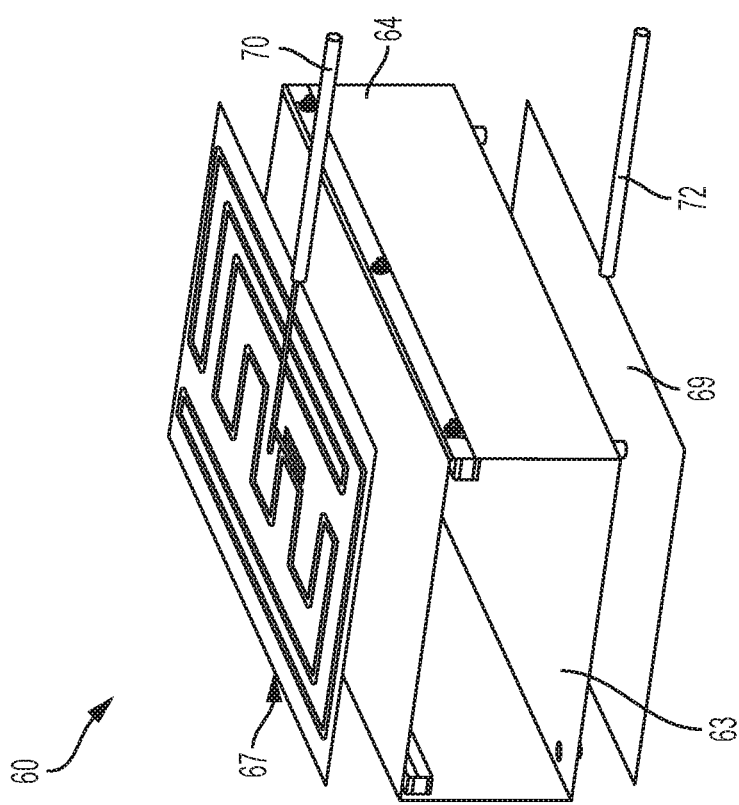
FIG. 9 is a side perspective and exploded view of a heater tunnel of the chamber of FIG. 5.
Figure 12:
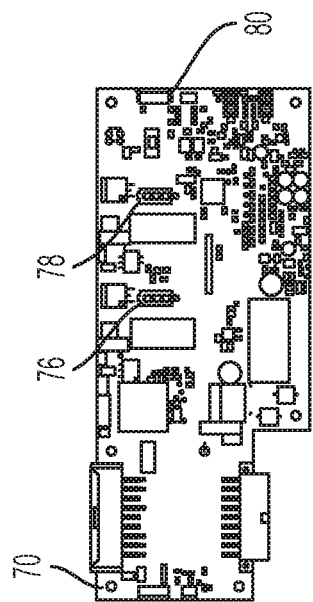
FIG. 12 is a top view of a printed circuit board of the chamber of FIG. 5.
Figure 11:
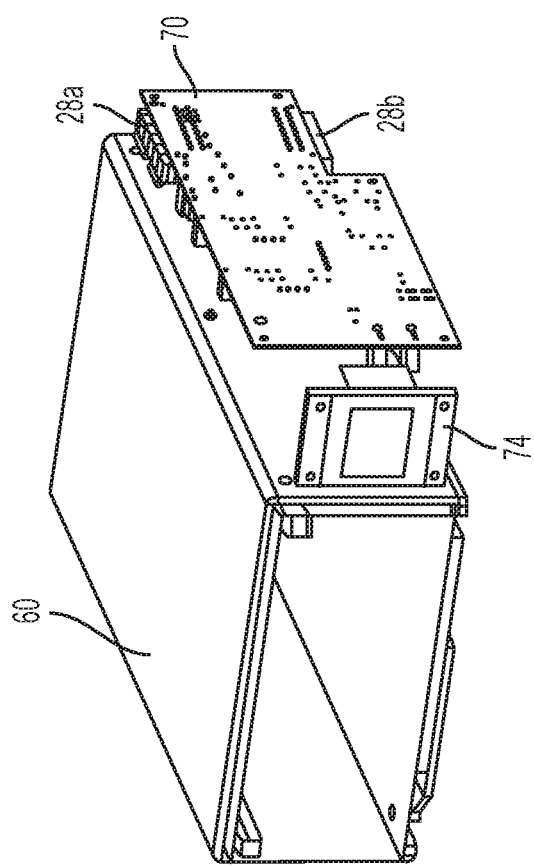
FIG. 11 is a side perspective view of some internal components of the chamber of FIG. 5, including a printed circuit board.
Figure 14:
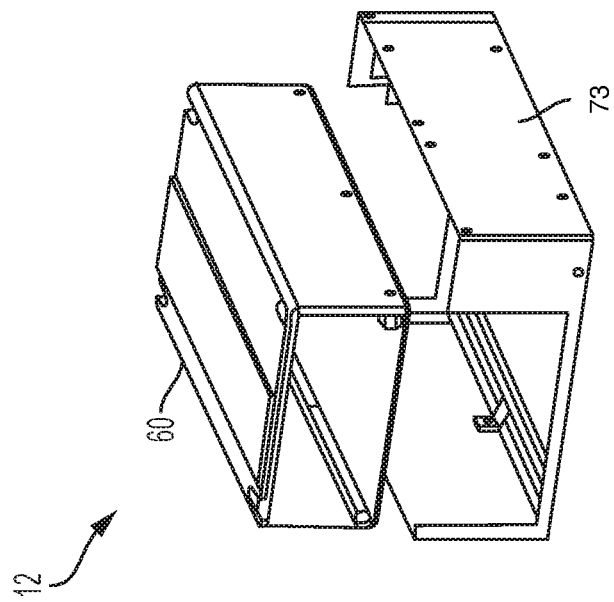
FIG. 14 is a side exploded view of the cover and heater tunnel of the chamber of FIG. 5.
Figure 13:
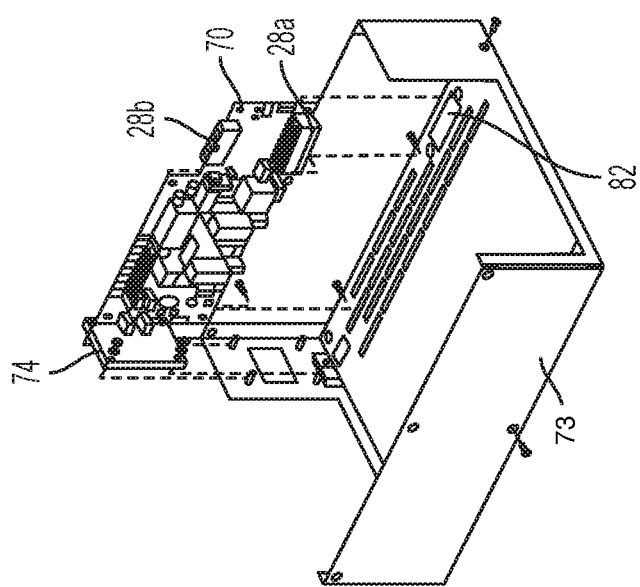
FIG. 13 is a bottom exploded view of a cover and printed circuit board of the chamber of FIG. 5.
Figure 15:
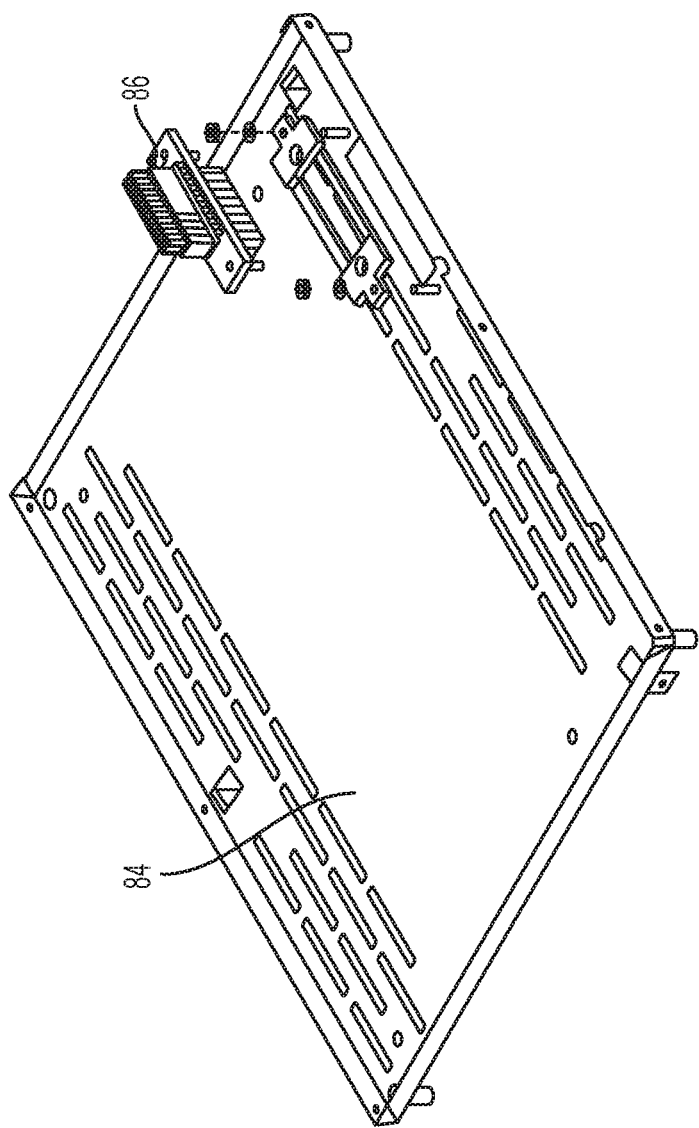
FIG. 15 is a top perspective view of a bottom panel and connector assembly of the chamber of FIG. 5.
Figure 16:
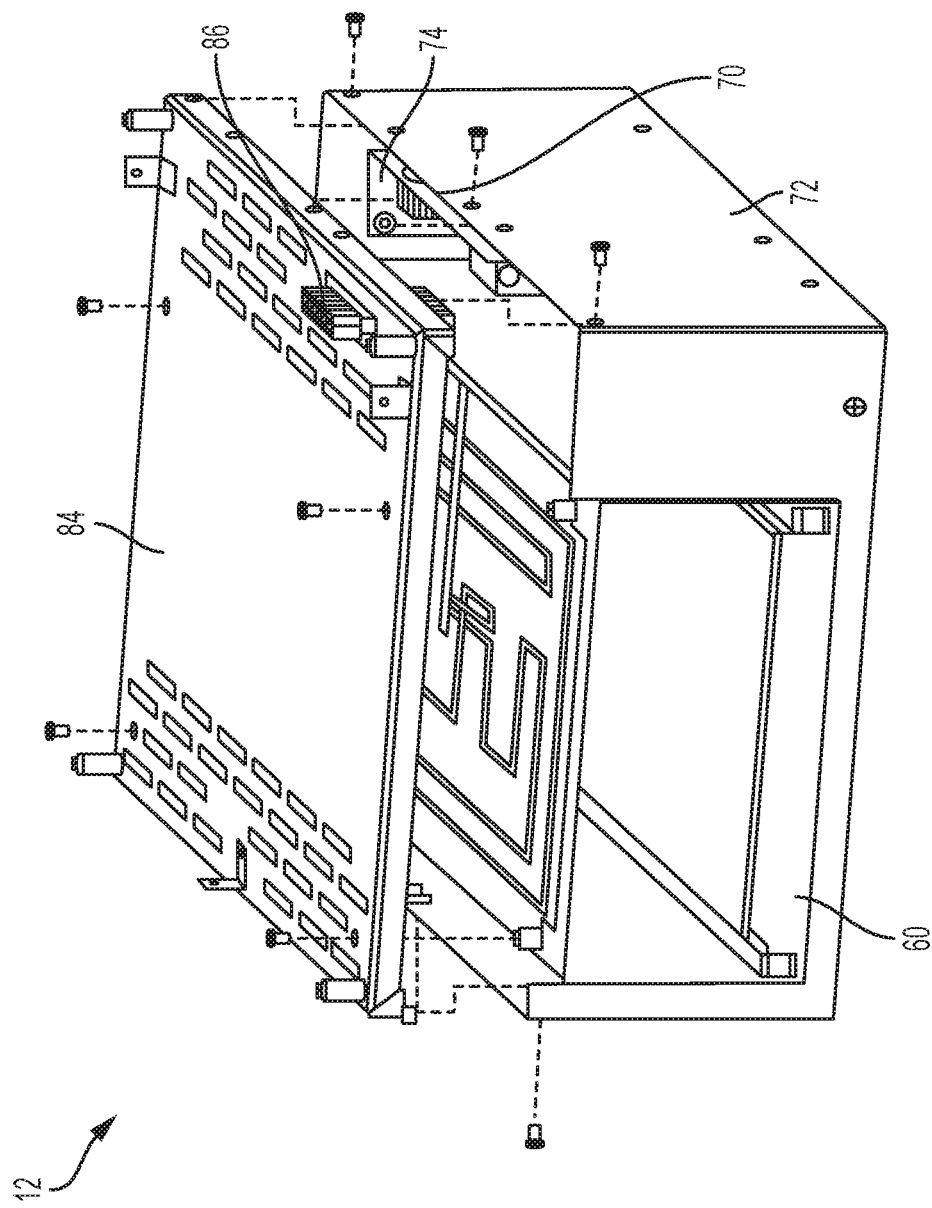
FIG. 16 is a bottom perspective and exploded view of the cover, heater tunnel, and bottom panel of the chamber of FIG. 5.
Figure 17:
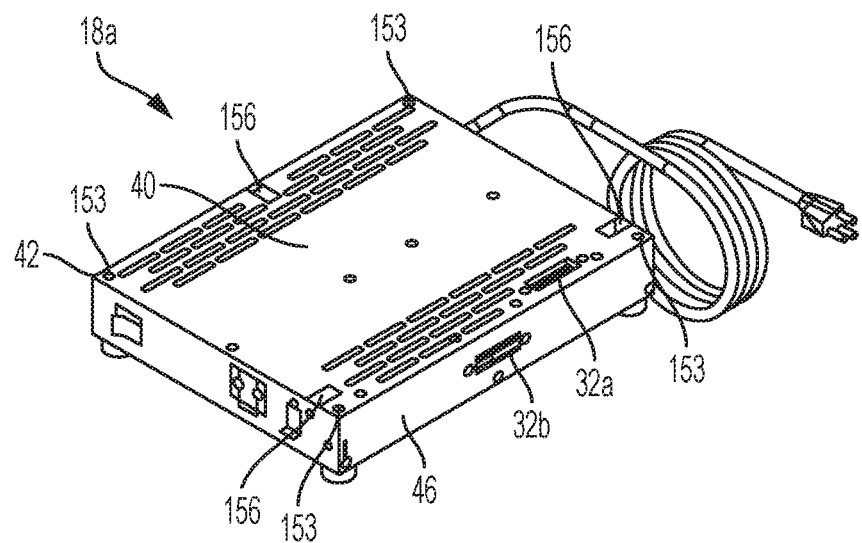
FIG. 17 is a top perspective view of a master base of the modular food holding system of FIG. 4.
Figure 18:
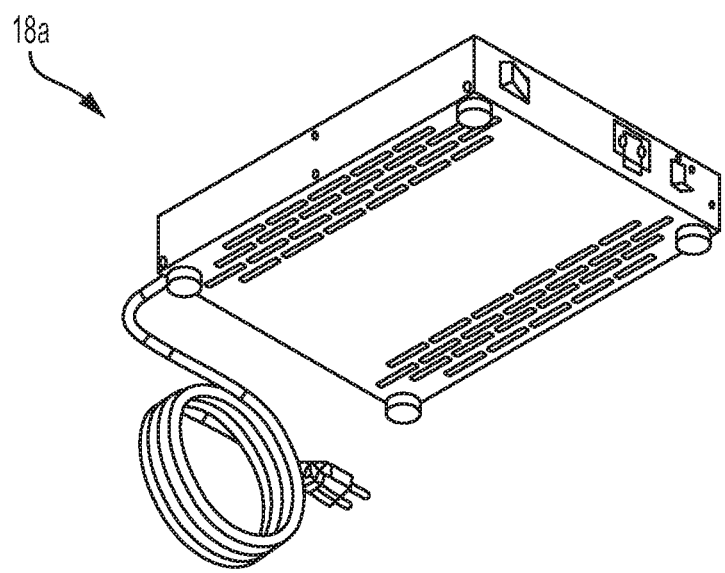
FIG. 18 is a bottom perspective view of the master base of FIG. 17.
Figure 19:
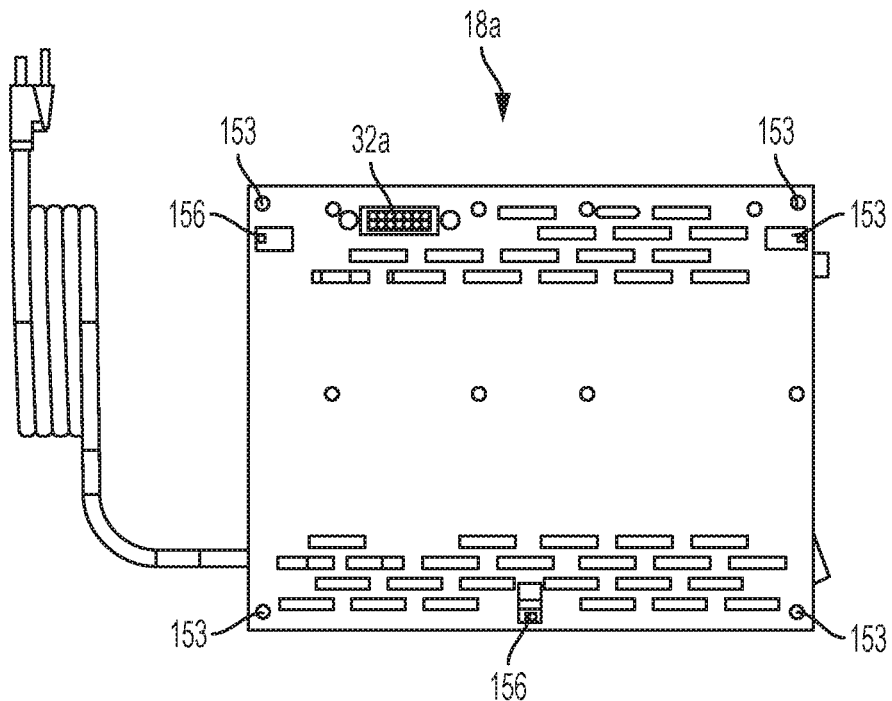
FIG. 19 is a top plan view of the master base of FIG. 17.
Figure 20:
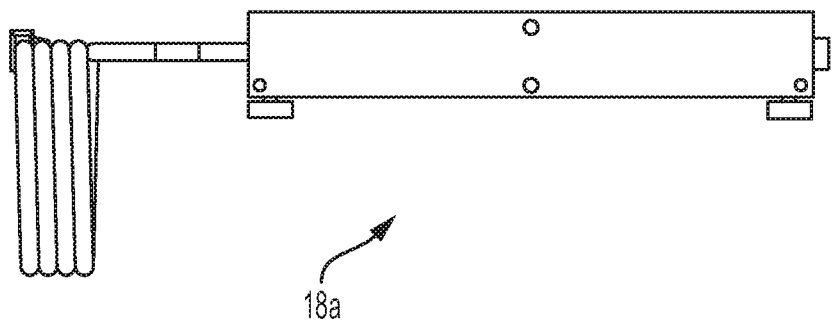
FIG. 20 is a side plan view of the master base of FIG. 17.
Figure 22:
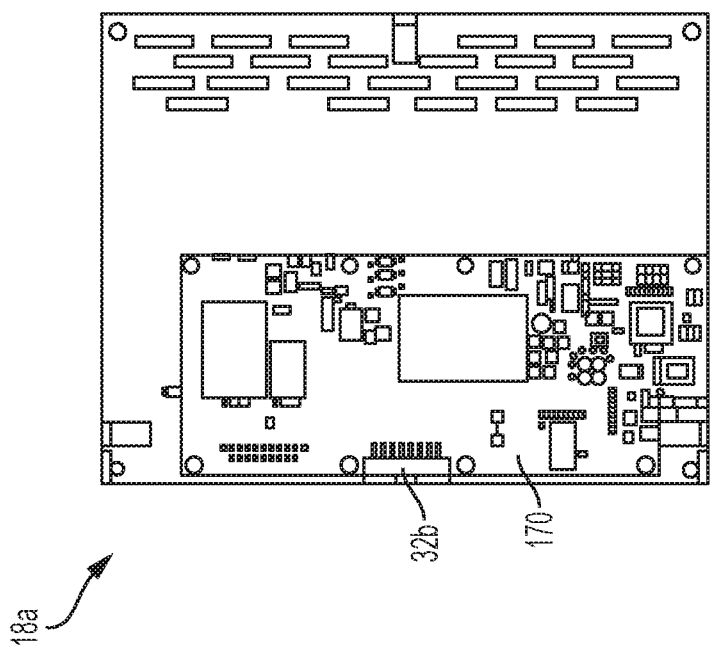
FIG. 22 is a top plan view of the bottom panel and printed circuit board of FIG. 21.
Figure 21:
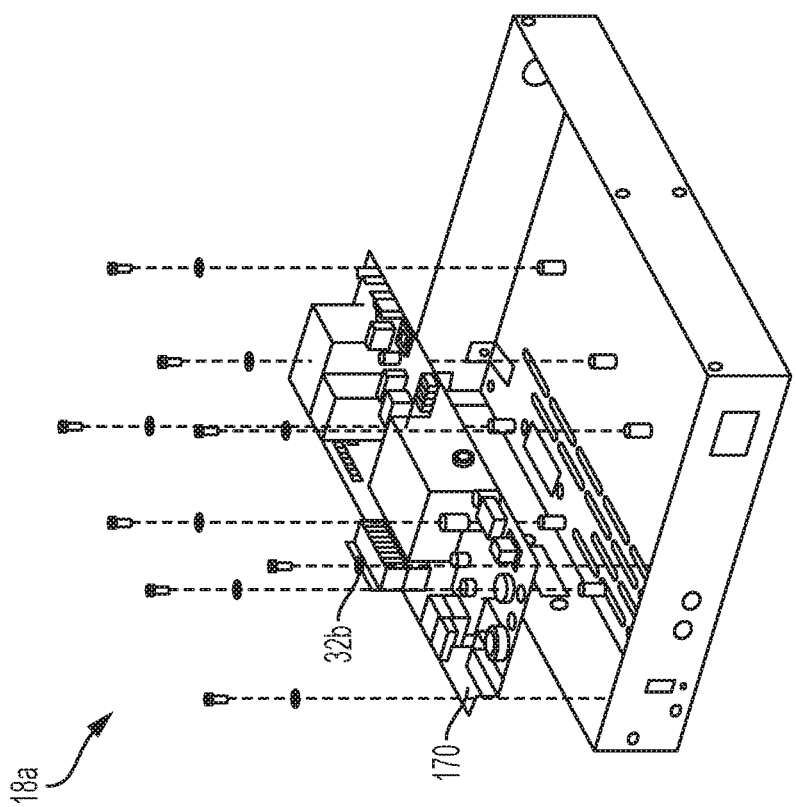
FIG. 21 is a top perspective and exploded view of a bottom panel and printed circuit board of the master base of FIG. 17.
Figure 24:
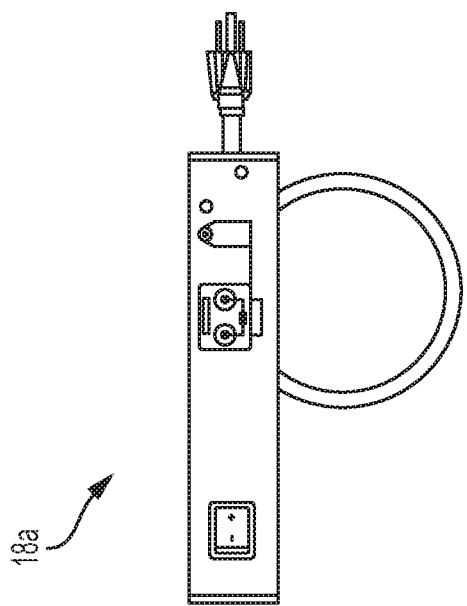
FIG. 24 is a front plan view of the master base of FIG. 17.
Figure 23:
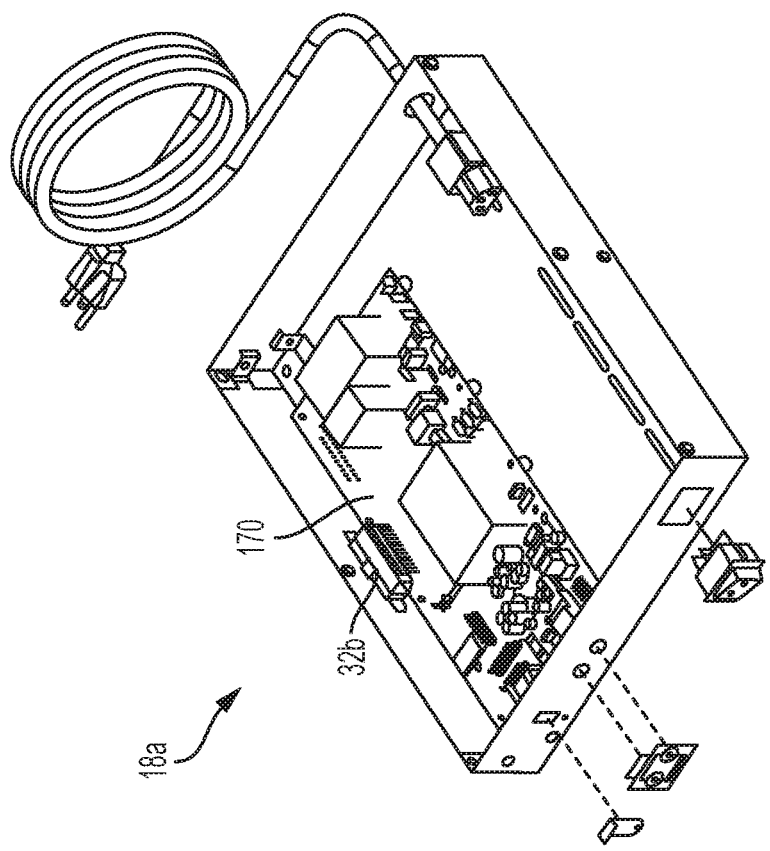
FIG. 23 is a top perspective view of the master base of FIG. 17 with a top cover removed.
Figure 25:
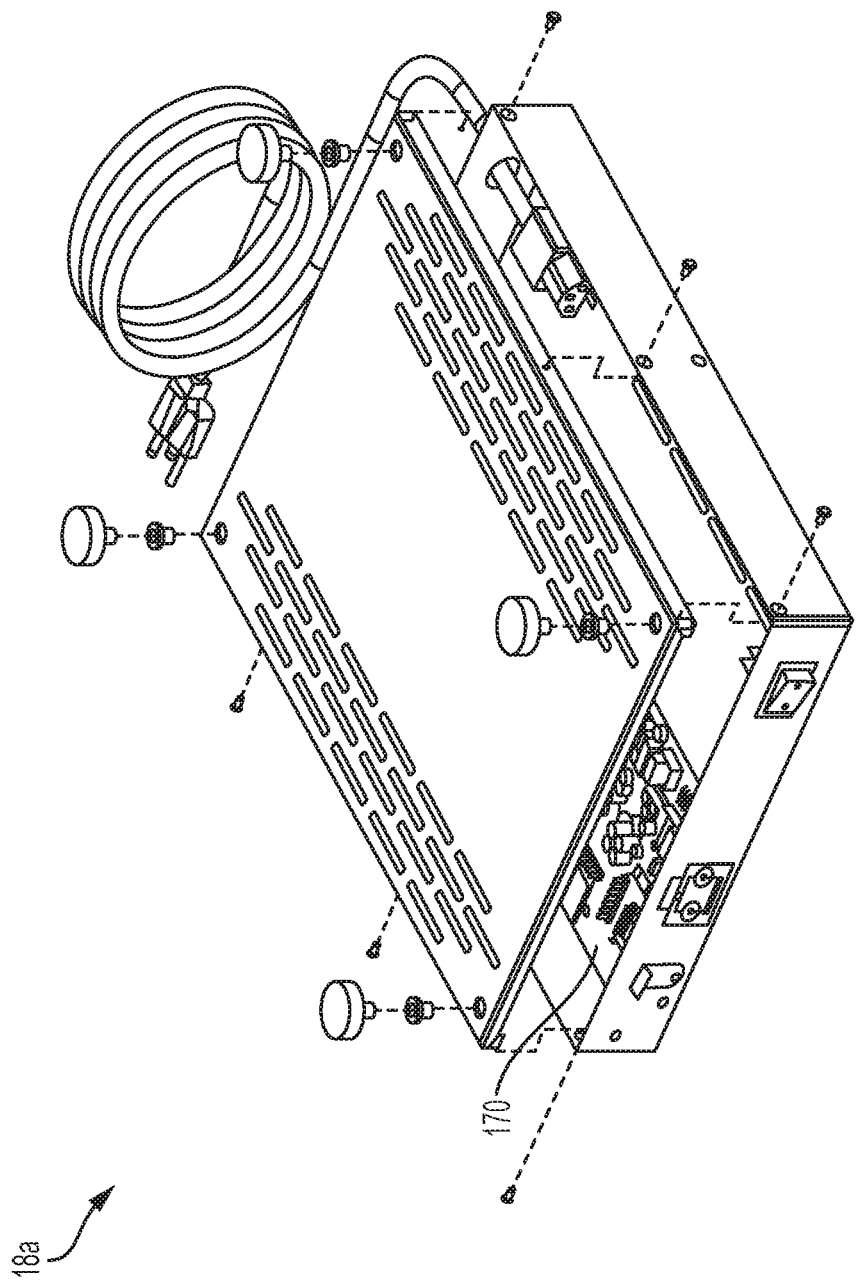
FIG. 25 is a top perspective and exploded view of the master base of FIG. 17.
Figure 26:
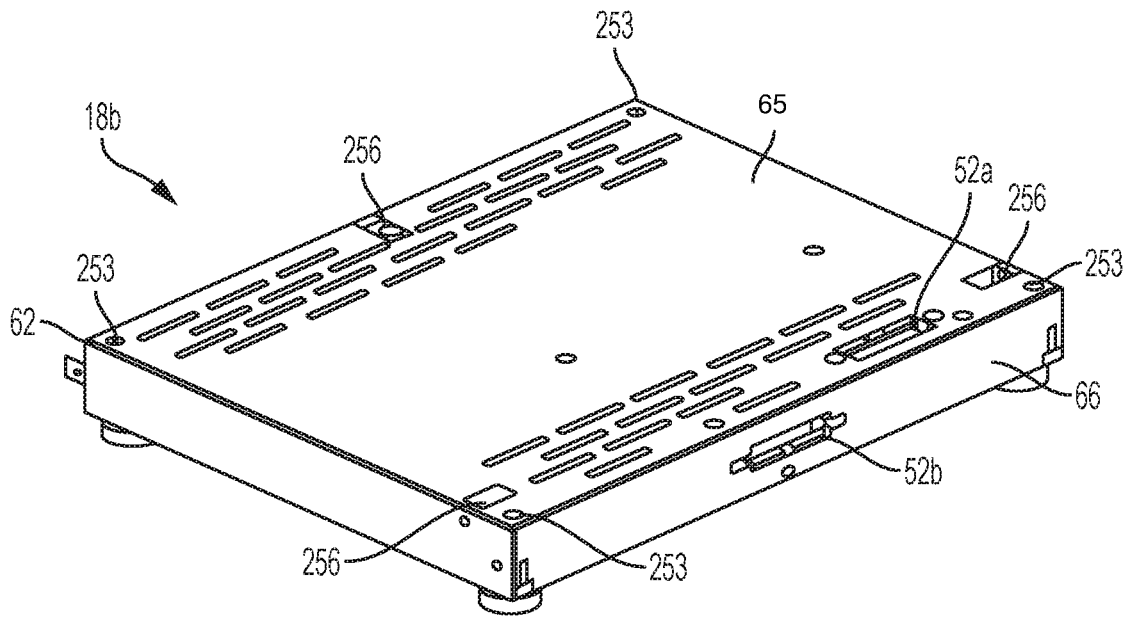
FIG. 26 is a top perspective view of an expansion base of the modular food holding system of FIG. 4.
Figure 27:
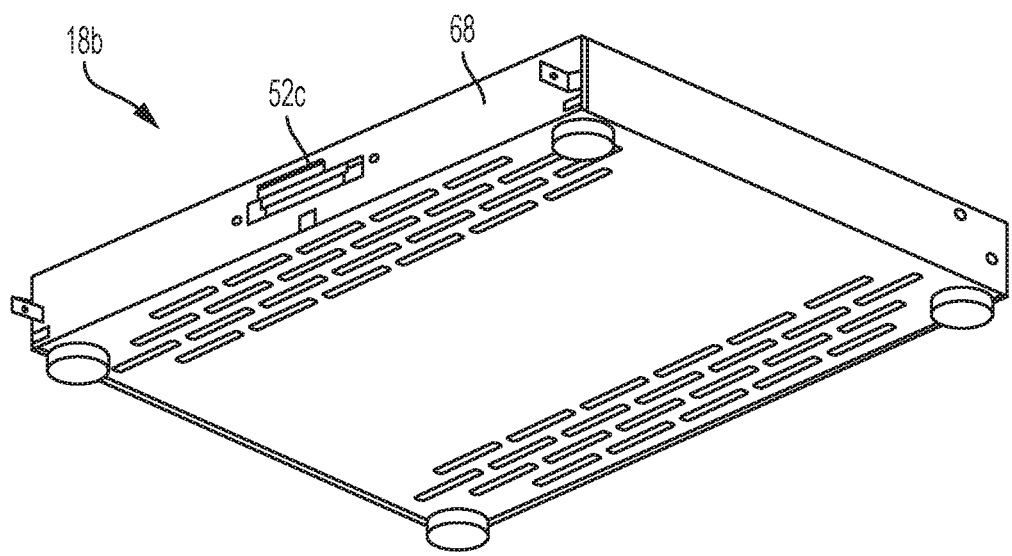
FIG. 27 is a bottom perspective view of the expansion base of FIG. 26.
Figure 29:
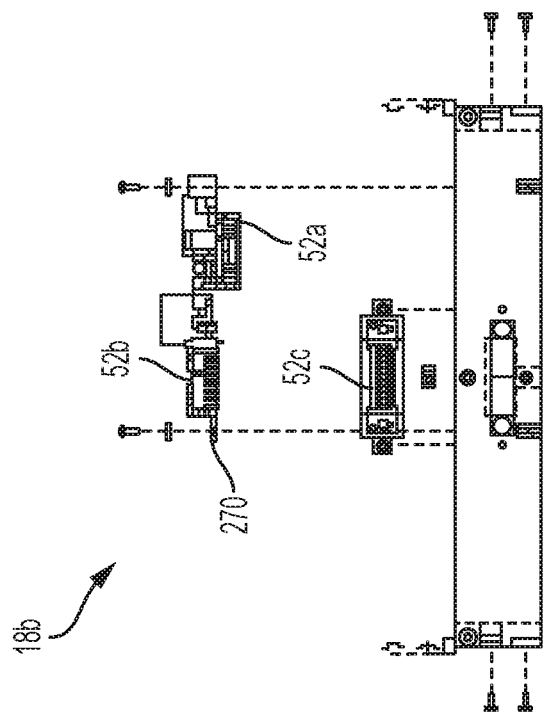
FIG. 29 is a side exploded view of the expansion base of FIG. 26.
Figure 28:
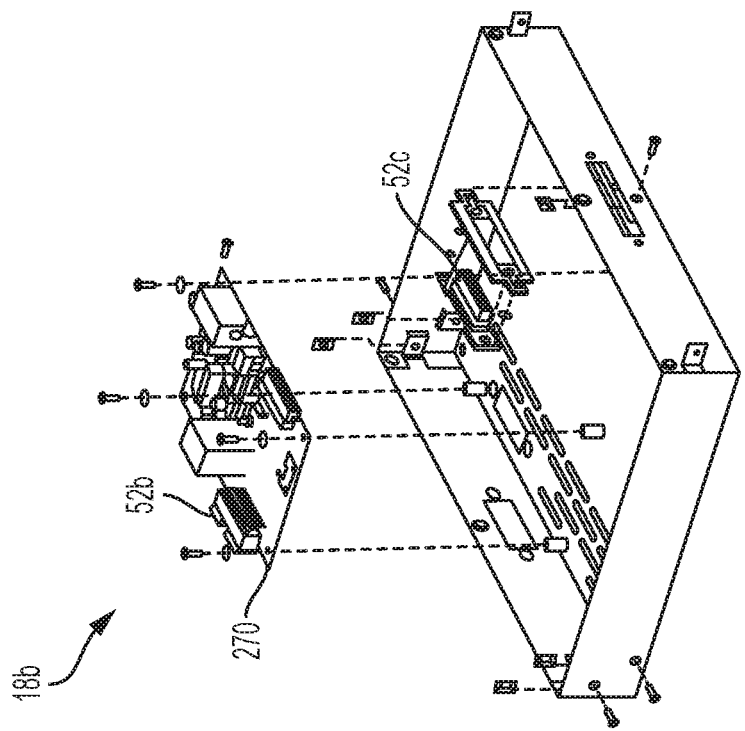
FIG. 28 is a top perspective and exploded view of the expansion base of FIG. 26.

Turning more specifically to FIGS. 9 and 10, the food holding chamber 12 may include an inner heating compartment 60 located within the chamber housing 20. The inner heating compartment 60 includes a heated cavity 63 that forms the chamber cavity 22, which is configured to receive food items and/or is configured to receive a food holding tray 24. The heated cavity 63 has a heated cavity housing 64 that forms a pass-through opening in the illustrated embodiment. In other embodiments, the heated cavity 63 may form a blind cavity having an end wall and only one opening. A first heating element 67 may be located proximate a top surface of the heated cavity housing 64 and a second heating element 69 may be located proximate a bottom surface of the heated cavity housing 64. The first and second heating elements 67, 69 may be conductive heating elements (such as electric heating wires), convective heating elements (such as heated fans), or radiant heating elements (such is infrared heating lamps). In one embodiment, the first heating element is a radiant heating element and the second heating element is a conductive heating element. The first and second heating elements 67, 69 may be fixed to the heated cavity housing 64 by mechanical fasteners, thermal epoxy, or any other method of securing a heating element to a chamber. The first heating element 67 may be connected to a power source by a first wire 70 and the second heating element may be connected to the power source by a second wire 72.

Turning now to FIGS. 11-16, the food holding chamber 12 comprises the inner heating compartment 60, a printed circuit board (PCB) 70 attached to the inner heating compartment 60, and an outer shell 73 that receives the inner heating compartment 60 and the PCB 70. In some embodiments, a display module 74 may also be attached to the inner heating compartment 60 and communicatively connected to the PCB 70. The PCB 70 may include a first heating element connection 76, a second heating element connection 78, and a display module connection 80 for operatively connecting the PCB 70 to the first heating element 67, to the second heating element 69, and to the display module 74, respectively. Operation of the first heating element 67, the second heating element 69, and the display module 74 are discussed in more detail below. The PCB 70 is also operatively connected to the upstream power and communication port 28a, which extends through an opening 82 in the outer shell 72 when assembled. Similarly, the PCB 70 is operatively connected to the downstream power and communication port 28b.

An open bottom of the outer shell 72 is covered by a bottom panel 84. The bottom panel 84 includes a power safety adapter 86. The power safety adapter 86 is connected to the upstream power and communications port 28a. The power safety adapter 86 prevents power being transferred into the PCB 70 unless the power safety adapter 86 is fully connected to a downstream power and communications port 28b of another food holding chamber, a downstream power and communications port 32a of a master base 18a, or a power and communications port 52a of an expansion base 18b.

Returning now to FIGS. 17-25, the master base 18a may include alignment mechanisms, such as holes 153 that receive the posts 50 of the food holding chambers 12 when a food holding chamber 12 is stacked upon the master base 18a. Similarly, the master base 18a may include securing mechanisms, such as openings 156 that receive the brackets 54 of the food holding chambers 12 when a food holding chamber 12 is stacked upon the master base 18a. Similar to the food holding chambers 12, the master base 18a includes a PCB 170 that is operatively connected to the power and communications ports 32a, 32b.

Returning now to FIGS. 26-30, the expansion base 18b may include alignment mechanisms, such as holes 253 that receive the posts 50 of the food holding chambers 12 when a food holding chamber 12 is stacked upon the expansion base 18b. Similarly, the expansion base 18a may include securing mechanisms, such as openings 256 that receive the brackets 54 of the food holding chambers 12 when a food holding chamber 12 is stacked upon the expansion base 18b. Similar to the food holding chambers 12, the expansion base 18b includes a PCB 270 that is operatively connected to the power and communications ports 52a, 52b, 52c.

Figure 31:
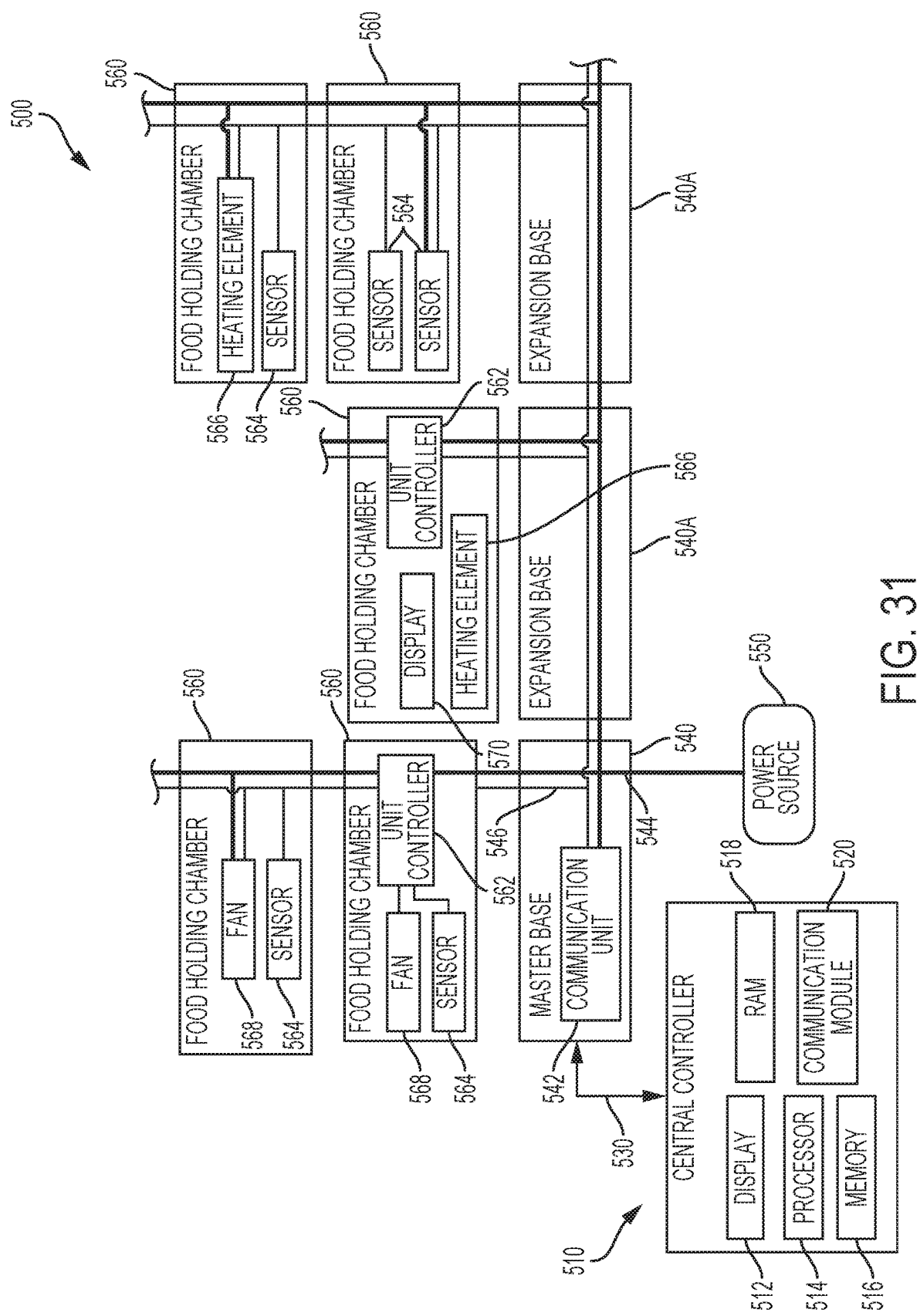
FIG. 31 is a schematic block diagram of the modular food holding system of FIG. 1.

FIG. 31 illustrates a schematic block diagram of an exemplary modular food holding system 500 and an exemplary central controller 510. In some embodiments, the modular food holding system 500 may include the central controller 510. In alternative embodiments, the modular food holding system 500 and the central controller 510 may be separate systems or devices, communicating by a communication connection 530. The modular food holding system 500 may be a system of individual modularized food holding chambers 560, which may be configured to store perishable food items. Such food holding chambers 560 may comprise individual food holding chambers 12 (FIG. 1), as discussed elsewhere herein. The food holding chambers 560 may be connected to other food holding chambers 560, a master base 540 (which may be a master base 18a), or one or more expansion bases 540A (which may be an expansion base 18b) (collectively referred to as the "components" of the modular food holding system 500, together with their sub-components disposed within any of the components). The connections between the components of the modular food holding system 500 may include a power connection 544 and a communication connection 546, which connect every food holding chamber 560 and every expansion base 540A to the master base 540. As illustrated in FIG. 31, additional food holding chambers 560 may be connected to any of the food holding chambers 560, and additional expansion bases 540A may be connected to the expansion bases 540A. In a preferred embodiment, however, only one master base 540 provides power and control commands from the central controller 510 to each food holding chambers 560, either directly or indirectly. Additionally, or alternatively, the master base 540 may be incorporated within one of the food holding chambers 560 in some embodiments.

The master base 540 forms the center of the power and communication network of the modular food holding system 500 and also serves as a communicative link to the central controller 510. A power source 550 is connected to the master base 540, which may either transform the power received or pass through the power without conversion. For example, the power source may be a 110V or 240V A/C source, which the master base 540 may convert to 12V D/C to power the food holding chambers 560. The master base 540 includes connections to provide power and communications to at least one expansion base 540A and at least one food holding chamber 560 directly via the power connection 544 and the communication connection 546. As noted, additional expansion bases 540A or food holding chambers 560 may be indirectly connected to the master base 540. The power connections 544 may include grounded, ungrounded, regulated, unregulated, single-phase, multiphase, direct, alternating current, or any other type power connection known or here-after developed. The communication connections 546 may include wired or wireless, analog or digital, addressable, mesh, single-wire, twisted pair, multi-conductor, cable, electrical, optical, or any other type of communication connection known or here-after developed. In some embodiments, multiple power connections 544 providing different power levels (e.g., 110V A/C and 12V DC) or multiple communication connections 546 providing different communication channels may be included between each pair of components of the modular food system 500.

In some embodiments, the master base 540 may further include a communication unit 542 configured to facilitate communication with the central controller 510 via the communication link 530. When present, the communication unit 542 receives data from the food holding chambers 560 via the communication connections 546, transmits the data to the central controller 510 via the communication link 530, receives control data from the central controller 510 via the communication link 530, and transmits the control data to the food holding chambers 560 via the communication connections 546. The data received from the food holding chambers 560 may include data received from elements disposed therein, including sensors 564, heating elements 566, fans 568, or displays 570. The communication link 530 may include a cord, a wireless connection, or a direct connection between a plug of the central controller and a socket of the master base. The communication link 530 may further include any known or hereafter developed wired or wireless electronic data communication medium or protocol, including wireless telephony (e.g., GSM, CDMA, LTE, etc.), Wi-Fi (802.11 standards), WiMAX, Bluetooth, Fieldbus (e.g., HART®, WirelessHART®, FOUNDATION® Fieldbus, etc.), or NFC protocols. In some embodiments, the communication link 530 may include an indirect link through a network, such as through one or more routers of a LAN or WAN. In some embodiments, the communication unit 542 may process the received communications to convert the received data or control data from one communication protocol into another communication protocol. In embodiments without a communication unit 542, the central controller 510 may be directly connected to the communication connections 546 through the communication link 530. In such embodiments, the communication link 530 may further be a wired communication link of the same type as the communication connections 546.

In further embodiments, the central controller 510 may be incorporated within the master base 540. In such embodiments, a communication unit 542 may be unnecessary, as the communication module 520 may communicate directly with the food holding chambers 560 via the communication connections 546. The central controller 510 in the master base 540 may receive data from food holding chambers 560, such as data indicating the configuration, operating state, connected devices (such as sensors, timers, fans, heaters, etc.), or user input (such as from a screen, switch, or button disposed within the food holding chamber 560). The central controller 510 within the master base 540 may provide control data to the food holding units 560. In particularly preferred embodiments, the central controller 510 may communicate control actions or control commands to the unit controllers 562 of the food holding chambers 560. Such control actions or commands may include control parameters, such as set points or ranges for operation. For example, the central controller 510 may communicate set points for temperature and humidity to the unit controller 562 of a food holding chamber 560, which may cause the unit controller 562 to operate elements or components of the food holding chamber 560 (e.g., heating elements, cooling elements, fans, sprayers, etc.) to maintain temperature and humidity at or near the set points received from the central controller 510. In some embodiments, such machine-level actuation of components or elements within the food holding chamber 560 by the unit controller 562 may occur without communication between the food holding unit 560 and the master base 540 or the central controller 510. For example, the unit controller 562 may receive sensor data regarding temperature, determine an adjustment to a heating element based upon set points or operating parameters previously received from the central controller 510, and control the operation of the heating element without further communication with the central controller 510. By providing operating parameters or set points to the unit controller 562 for operation of the components of the food holding chamber 560, the volume of data required to be communicated between the food holding chambers 560 and the central controller 510 may be significantly reduced. This may further permit control of a greater number of food holding chambers 560 by the central controller 510 or may permit communication through a lower-bandwidth communication protocol or connection.

One or more expansion bases 540A may be connected to the master base 540 through the power connections 544 and communication connections 546. Expansion bases 540A may similarly connect to additional expansion bases 540A through the power connections 544 and communication connections 546, thereby indirectly connecting the additional expansion bases 540A to the master base 540 (and, thereby, to the central controller 510 and the power source 550). Together with the master base 540, the expansion bases 540A may be referred to herein as the "bases." Each expansion base 540A simply serves to connect the master base 540 to additional expansion bases 540A or food holding chambers 560 allowing extension of the system in a modular fashion. In some embodiments, one or more expansion bases 540A may further be connected to a power source, either optionally or as a requirement of proper functioning. Such additional power source connections to the expansion bases 540A could be used to eliminate the power connections 544 between the expansion base 540A and other bases. In such embodiments, the communication connection 546 may be wireless connections, thereby eliminating the need for any physical connection between bases and allowing further extension of the modular food holding system 500. For wireless communication, the expansion bases 540A may further include communication units similar to 542 to transmit and receive data.

Each food holding chamber 560 is communicatively connected to the master base 540, either directly or indirectly through expansion bases 540A or other food holding chambers 560. The food holding chambers 560 may be identical modules, configured and connected as discussed elsewhere herein. Each food holding chamber 560 may include multiple power connections 544 and communication connections 546. The multiple connections may include an upstream connection and a downstream connection for each of the power connection 544 and communication connections 546. The upstream connections connect the food holding chamber 560 to the master base 540, either directly or through another food holding chamber 560 or an expansion base 540A. The downstream connections allow additional food holding chambers 560 to connect to the master base 540 through the food holding chamber 560.

The food holding chambers 560 may contain various combinations of elements or components, including sensors 564, heating elements 566, fans 568, or displays 570. These elements of the food holding chambers 560 may be permanently or removably disposed within or connected to the food holding chambers 560. Additionally, the elements may be directly connected to the power connections 544 or communication connections 546, or they may be indirectly connected thereto by a unit controller 562. The elements may be controlled by or based upon control commands from the unit controller 562 and/or the central controller 510 to adjust the physical environment within the food holding chamber 560 (e.g., using a heating element 566, a fan 568, a cooling element (not shown), or a toasting element (not shown)), generate data associated with the food holding chamber 560 (e.g., using a sensor 564), present information regarding the food holding chamber 560 (e.g., using a display 570), or take other actions.

The one or more sensors 564 may include devices for generating or collecting data associated with some aspect of a food holding chamber 560, including thermometers, humidistats, scales, position sensors, photosensors, user-operated or automatic switches, buttons, dials, or other similar devices. The sensors 564 may be configured to measure or generate data regarding the environment within the food holding chamber 560, such as temperature, humidity, volatility, or load status (e.g., contents type, weight, whether empty or loaded, etc.). In some embodiments, such sensor data may be collected and analyzed by a unit controller 562 in the food holding chamber 560.

In some embodiments, the sensors 564 may include smart sensors that sense characteristics of the environment within the food holding chamber 560. For example, the sensors 564 may comprise humidity sensors, electronic nose sensors that are capable of detecting food decomposition products (e.g., sulphur, amines, aldehydes, ethanol, ethylene, metal oxides, etc. by using gas chromatography, mass spectrometry and/or olfactometry) to determine the freshness of the food items stored within the food holding chamber 560, temperature sensors that directly measure the temperature of the environment within the food holding chamber 560, and load sensors that detect the presence of food items within the food holding chamber 560. The sensors 564 may be located anywhere in or around the food holding chamber 560, as long as the sensor is capable of directly measuring a characteristic of the environment within the food holding chamber 560 (e.g., within a headspace of a food holding tray). For example, the sensors 564 may be located underneath a cover of a food pan that is located within the food holding chamber 560, or built into a food pan itself that is located within the food holding chamber 560 (e.g., the sensor 564 may be mounted in a handle of the food pan and in fluid/gaseous communication with pan contents via a hole in the pan). The sensors 564 may transmit sensed data to the chamber base by a wired connection or by a wireless connection. The load sensors may comprise one or more of load cells, sonar detectors, and cameras.

The sensors 564 allow food stored within the food holding chamber 560 to be stored in a stasis mode, which prevents further cooking of the food while inhibiting bacterial growth. Generally, food has to be stored at less than 40° F. or greater than 140° F. (which is commonly referred to as a food safe zone, and which may be defined in the NSF as a minimum food safety temperature) to prevent rapid bacterial growth and or to minimize microbial growth. Additionally, the sensors 564 may communicate with a display and the display may display a symbolic representation of the quality of food that is stored within the food holding chamber based on information received from the sensor. For example, the display may include color coded quality indications (e.g., green, yellow, red) that are based on the decomposition products detected in the food holding chamber.

The one or more heating elements 566 may include metal, ceramic, composite, or other heating elements for heating or cooling the interior of the food holding module 560. The one or more fans 568 may include axial fans, centrifugal fans, cross-flow fans, bellows, or other means of venting or circulating air within the food holding module 560. The one or more displays 570 may include LCD display screens, touch screen displays, LED displays, indicator lights, or other information display devices. Additionally, or alternatively, other types of elements may be included in one or more of the food holding chambers 560, such as speakers, sirens, buzzers, etc.

Some or all food holding chambers 560 may include unit controllers 562, in some embodiments, which may be connected to the power connections 544 and communication connections 546 of the food holding chambers 560. The unit controller 562 may receive control communications from the central controller 510 and operate one or more elements disposed within the food holding chamber 560. Operation of the one or more elements disposed within the food holding module 560 by the unit controller 562 may occur with or without communication between the unit controller 562 and the master base 540. With such communication, for example, a control command to reduce power to a heating element 566 to decrease temperature in a food holding chamber 560 may be received at the unit controller 562, which may control the power received by the heating element 566. In response to receiving the control command, the unit controller 562 may reduce the power received by the heating element 566. Without such communication, however, the unit controller 562 may receive sensor data regarding temperature, determine whether to increase or decrease temperature in the food holding chamber 560 based upon a target temperature (e.g., a temperature parameter or set point), determine a corresponding increase or decrease in power to the heating element 566, and cause the power supplied to the heating element to be adjusted accordingly. Although operation of the one or more elements of the food holding chamber 560 may not involve communication between the unit controller 562 and the master base 540, the unit controller 562 may be received from the central controller 510 of or through the master base 540.

In a similar manner, the unit controller 562 may control a sensor 564, a fan 568, a display 570, or other elements or components of the food holding chamber 560 (including elements or components of a food holding tray 24). In some embodiments, the unit controller 562 may communicate data regarding the food holding module 560 through the upstream communication connection 546 and the master base 540 to the central controller 510 via the communication link 530. Such data may indicate the location or configuration of the food holding module 560. The central controller 510 may use this data to determine a configuration or arrangement of the one or more food holding chambers 560 of the modular food holding system 500. The central controller 510 may further provide control commands, control actions, operating parameters, or set points to the unit controller 562.

Although the food holding chambers 560 may include a variety of electrical or electronic elements, including those discussed above, the elements may be limited in some embodiments for reliability or cost. In some embodiments, therefore, the electrical elements may include only one or more of the following elements (plus the necessary wiring or other connections for the power connections 544 and the communication connections 546): a timer switch, a heating element, a fan, or an indicator light. In additional embodiments, the limited electrical elements may further include one or more unit controllers 562. In further embodiments, the electrical elements of the food holding chambers 560 may include any one or more elements or components for sensing or adjusting one or more aspects of the environment within the food holding chambers 506, but the unit controller 562 of each food holding chamber 562 may be configured to require operating parameters, set points, or control commands from the central controller 510.

As discussed above, the master base 540 may be communicatively connected to the central controller 510 by the communication link 530, or the central controller 510 may be incorporated within the master base 540. The central controller 510 may be a general- or special-purpose computing device, such as a desktop computer, notebook computer, tablet computer, smart phone, other mobile device, or wearable computing device. In some embodiments, the central controller 510 may be configured to physically connect to a socket or plug of the master base 540, such that the central controller 510 forms a fixed or adjustable part of the modular food holding system 500. In other embodiments, the central controller 510 may be wired to or wirelessly connected to the master base 540. Through the master base 540, the central controller 510 receives data from and transmits data to the one or more food holding chambers 560 of the modular food holding system 500, such as configuration information or operating parameters. In some embodiments, the central controller 510 may be mounted at a fixed location with respect to the modular food holding system 500, such as on top of one or more food holding chambers 560, hanging below one or more bases, etc. In alternative embodiments where the central controller 510 is wirelessly connected to the master base 540, a storage slot (not shown) may further be provided to hold the central controller 510 when not in use.

The central controller 510 may include a display 512 for presenting information to an operator. In some embodiments, the display may be a touch screen display, configured to receive input from the operator. In further embodiments, the central controller 510 may include an input device, such as a keyboard, mouse, microphone, or touch pad. The central controller 510 may further include one or more processors 514 to receive, process, generate, determine, transmit, and store data. The one or more processors of the central controller 510 may access a random access memory (RAM) and a memory 516 for storing an operating system, software programs, applications, routines, scripts, or other data. The memory 516 may be a non-transitory computer readable memory, storing instructions executed by the one or more processors 514. In some embodiments, the central controller 510 may also include, or otherwise be communicatively connected to, other data storage mechanisms (e.g., one or more hard disk drives, optical storage drives, solid state storage devices, etc.) that reside within the central controller 510 or are connected thereto via a computer network. Moreover, in thin-client implementations, additional processing and data storage may be provided by one or more servers (not shown) connected via a network.

In some embodiments, the central controller 510 may further include a communication module 520 for communicating with the communication unit 542 of the master base 540 or directly with the food holding chambers 560 via the communication link 530 and the communication connections 546. The communication module 520 may further transmit and receive wired or wireless communications with the master base 510 or external devices (not shown), using any suitable wireless communication protocol network, such as a wireless telephony network (e.g., GSM, CDMA, LTE, etc.), a Wi-Fi network (802.11 standards), a WiMAX network, a Bluetooth network, etc. Additionally, or alternatively, the communication module 520 may also be capable of communicating using a near field communication standard (e.g., ISO/IEC 18092, standards provided by the NFC Forum, etc.) The components of the central controller 510 (including the display 512, processor 514, memory 516, RAM 518, and communication component 520) may be interconnected via an address/data bus or other means.

In some embodiments, the communication module 520 may be configured to facilitate communication between multiple central controllers 510. In further embodiments, the communication module 520 may be configured to receive data from a static or dynamic data source configured by another central controller 510. For example, a desktop or laptop computer may be used as a first central controller 510 to configure operating parameters for the food holding chambers 560 of the modular food holding system 500, and information related to such configuration of the operating parameters of the food holding chambers 560 may be transferred to a second central controller 510 for communication and implementation within the modular food holding system 500. Such second central controller 510 may include a central controller 510 incorporated within the master base 540, which may receive the configuration information via the communication module 520. In some embodiments, such transfer of configuration information may include uploading the information from the first central controller 510 to a storage device (e.g., a flash memory drive, a USB memory device, or a network drive), then downloading the configuration information to the second central controller 510 from the storage device. In some such embodiments, the second central controller 510 incorporated within the master base 540 may omit the display 512 or have only limited display functionality.

In further embodiments, multiple central controllers 510 may be connected to the master base 540 through one or more communication links 530. This may allow multiple devices or operators to simultaneously control the modular food holding system 500. In further embodiments, multiple modular food holding systems 500 may be communicatively connected to one or more central controllers 510 through one or more communication links 530 to the master bases 540 of each modular food holding system 500. For example, a commercial kitchen may have several modular food holding systems 500 positioned at different locations in the kitchen, each of which includes a master base 540 and one or more food holding chambers 560. Each master base 540 may be physically or wireless connected to a central controller 510 dedicated to control of the modular food holding system 500 corresponding to the particular master base 540. Additionally, some or all of the master bases 540 may further be communicatively connected to an additional central controller 510. Such additional central controllers 510 may also be configured to control only one modular food holding system 500 or may instead be configured to control a plurality of modular food holding systems 500. The former configuration may allow multiple central controllers 510, such as those positioned at opposite ends of a long row of food holding chambers 560 for easy access by one or more operators. The latter configuration may allow a central operator to monitor or control multiple modular food holding systems 500 located around the kitchen from a central location, such as a manager's office.

Figure 32:
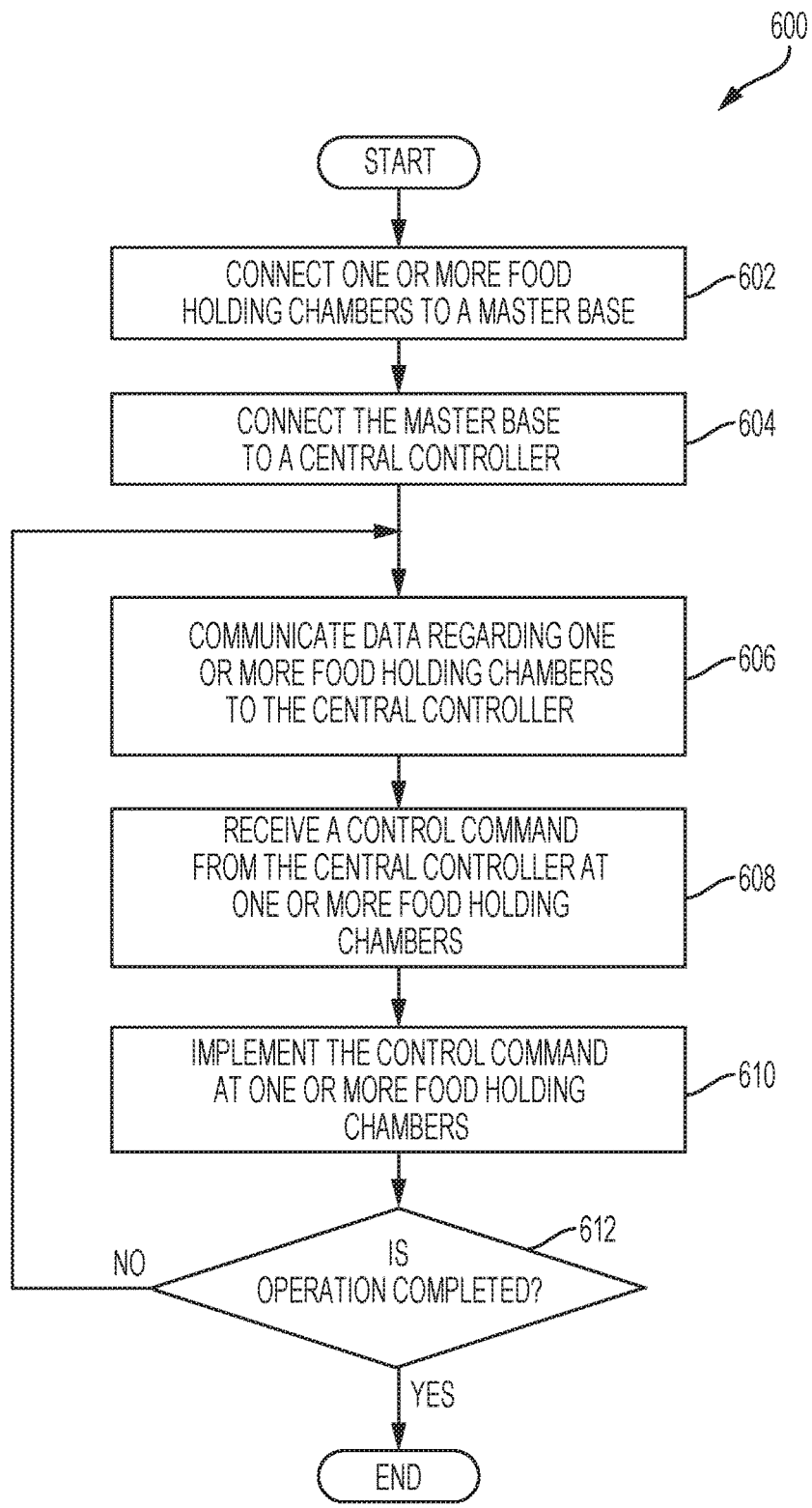
FIG. 32 is a logic flow diagram of an exemplary monitoring method that may be implemented by the modular food holding system of FIG. 1.

FIG. 32 illustrates a flow diagram of an exemplary monitoring method 600 for monitoring a modular food holding system 500 (FIG. 31). The modular food holding system 500 may implement this method to monitor and control the one or more food holding chambers 560 in conjunction with one or more central controllers 510. The method 600 may begin by connecting one or more food holding chambers 560 to the master base 540, either directly or indirectly, at block 602. The master base 540 may then be communicatively connected to the central controller 510 at block 604. Until operation of the modular food holding system 500 is determined to be complete at block 612, the method 600 may then continue to communicate data and control the operation of one or more elements within the one or more food holding chambers 560. The one or more food holding chambers 560 may communicate data to the central controller 510 via the master base 540 at block 606. The one or more food holding chambers 560 may then receive control commands from the central controller 510 via the master base 540 at block 608 and may implement the control commands at block 610. Once operation of the modular food holding system 500 is determined to be complete at block 612, the method 600 may terminate.

At block 602, the method 600 may begin with the connection of one or more food holding chambers 560 to the master base 540. As discussed above, the food holding chambers 560 may be connected to the master base 540 via power connections 544 and communication connections 546 through one or more other food holding chambers 560 or expansion bases 540A.

At block 604, the master base 540 may be connected to the central controller 510. This connection may be made by a wired or wireless connection via the communication link 530. The connection may be established by either the central controller 510 or the master base 540 in various embodiments. In some embodiments, the central controller 510 may establish a communicative connection with the one or more food holding chambers 560 through the master base 540, such as by polling the unit controllers 562 of the food holding chambers 560 to determine the configuration or arrangement of the modular food holding system 500. As discussed above, the master base 540 may include a central controller 510, in which case the communication connection may be to a further central controller 510 having the same or additional functionality.

At block 606, the master base 540 may communicate data regarding the one or more food holding chambers 560 to the central controller 510 through the communication link 530. In some embodiments, the one or more food holding modules 560 may generate and communicate the data directly through the master base 540. In other embodiments, the master base 540 may receive and convert data from the one or more food holding chambers 560 prior to transmitting the data to the central controller 510. The data may include information regarding the temperature, humidity, heat source location, or sensor data from one or more sensors 564 disposed within the one or more food holding chambers 560, as well as other information regarding the one or more food holding chambers 560. In further embodiments, the data may indicate the position, configuration, location, or arrangement of the one or more food holding chambers 560 within the modular food holding system 500. In yet further embodiments, the data may include information regarding general operating configurations of the one or more food holding chambers 560, such as operating parameters, operating status (e.g., whether the food holding chamber 560 has been turned on, is operating correctly, etc.), or a code identifying one of a plurality of pre-set operating modes (including a plurality of operating parameters or set points). In embodiments wherein the master base 540 includes a central controller 510, the data may be received from the food holding chambers 560 by the central controller 510 within the master base 540. The central controller 510 within the master base 540 may then determine whether to further communicate the data to an external central controller 510 or to perform control functions within the master base 540.

At block 608, the one or more food holding chambers 560 may receive one or more control commands from the central controller 510. The control commands may be generated by the central controller 510 and transmitted via the communication link 530 through or from the master base 540 to the one or more food holding chambers 560. Where applicable, the control commands may be received at the unit controllers 562 of one or more food holding chambers 560. Additionally, or alternatively, the control commands may be received by the elements disposed within the one or more food holding chambers 560 (e.g., sensors 564, heating elements 566, fans 568, displays 570, or other elements). Where the control commands are received by the unit controllers 562, the control commands may include element operation commands (directly controlling components or elements disposed within the food holding chambers 560) or operating parameters (establishing set points, targets, ranges, or conditions for the unit controllers 562 to use in operating the components or elements disposed within the food holding chambers 560).

At block 610, the one or more food holding chambers 560 may implement the received control commands. Implementation of the control commands may include taking one or more of the following actions using one or more elements disposed within the one or more food holding chambers 560: presenting an alert, illuminating an indicator light, displaying a countdown, controlling the temperature, or controlling the humidity. In some embodiments, the actions may be controlled by the unit controller 562 in response to receiving one or more control commands. In particularly preferred embodiments, the unit controller 562 will operate the food holding chamber 560 to adjust the environment within the food holding chamber 560 (e.g., temperature, humidity, etc.) using one or more electrical components or elements of the food holding chamber 560 based upon operating parameters or set points received from the central controller 510 as control commands.

At block 612, the method 600 may determine whether operation of the modular food holding system 500 is complete. Determining whether operation is complete may include receiving a signal indicating further operation or discontinuance of operation from the central controller 510. This may include a determination to terminate operation based upon expiration of a timer or due to an emergency shut-down condition being reached. Alternatively, determining whether operation is complete may include continuing operation until power is switched off or the power source 550 is removed. When operation is not complete, the method 600 may continue with communicating further data regarding the one or more food holding chambers 560 at block 606. When operation is determined to be complete, the method 600 may terminate.

Figure 33:
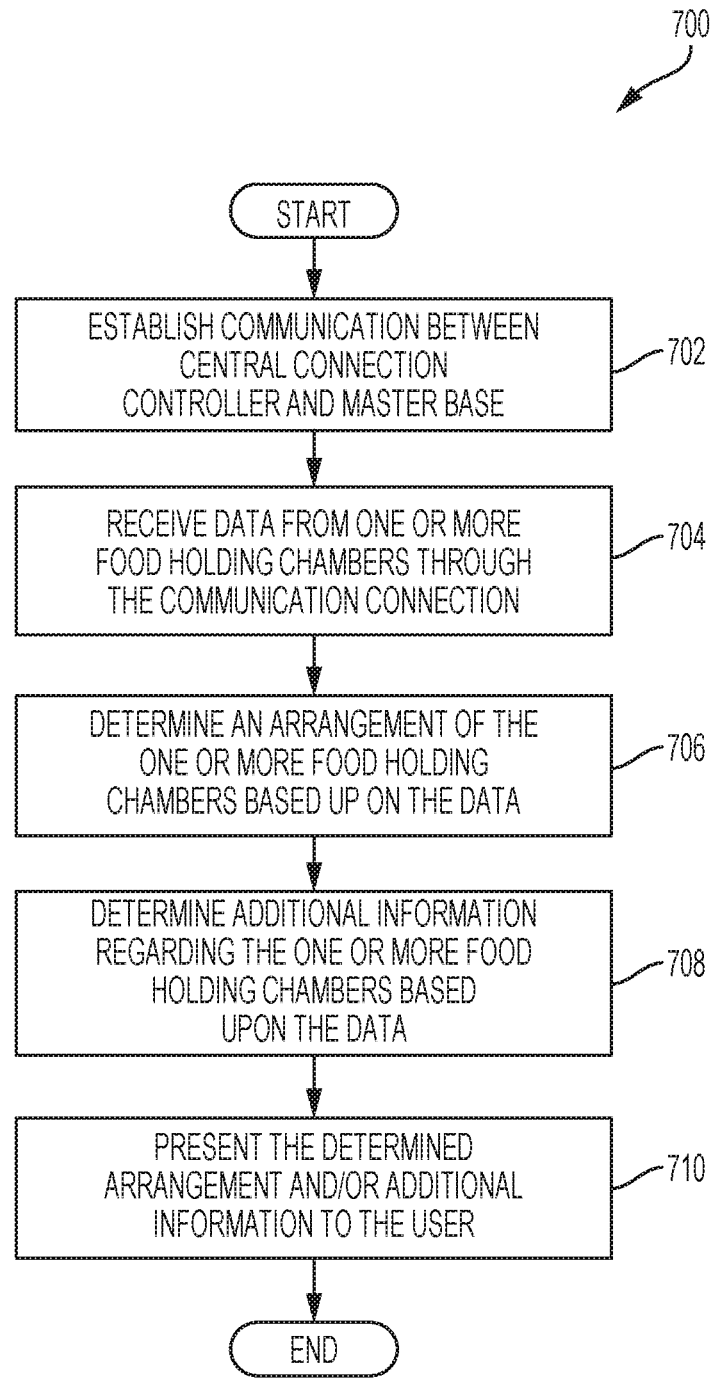
FIG. 33 is a logic flow diagram of an exemplary communication method for a central controller connected to the modular food holding system of FIG. 1.

FIG. 33 illustrates a flow diagram of an exemplary communication method 700 for a central controller 510 connected to a modular food holding system 500. The method 700 may be implemented by one or more central controllers 510 to monitor one or more modular food holding systems 500. The method 700 may begin by establishing a communicative connection between the central controller 510 and the master base 540 of the modular food holding system 500 at block 702. Once the connection is established, the central controller 510 may receive data from one or more food holding chambers 560 through the communicative connection at block 704. Based upon the received data, the central controller 510 may then determine an arrangement of the one or more food holding chambers 560 of the modular food holding system 500 at block 706. The central controller 510 may further determine additional information regarding the one or more food holding chambers 560 at block 708. Then the determined arrangement or other information may be presented to a user at block 710. The method 700 may then end, or the central controller 510 may continue to receive data, determine arrangement or other information regarding the one or more food holding chambers 560, and present the information to the user while the modular food holding system 500 is in operation.

At block 702, the method 700 may begin with establishing the communicative connection between the central controller 510 and the modular food holding system 500 through the master base 540. The connection may be established by either the controller 510 or the master base 540. In some embodiments, the controller 510 or the master base 540 may automatically attempt to establish a connection when powered up or when no connections are found. In other embodiments, the user may direct the central controller 510 or the master base 540 to establish the communicative connection. The communicative connection may be established through the communication link 530, which may be wired or wireless, as well as direct or indirect, as further discussed above.

At block 704, the central controller 510 may receive data from the one or more food holding chambers 560 of the modular food holding system 500. The data may be received via the communicative connection over the communication link 530. As discussed elsewhere herein, the central controller 510 receives the data through the master base 540, which is further directly or indirectly connected to the one or more food holding chambers 560. The data may include data from one or more sensors 564 disposed within the one or more food holding chambers 560, which sensor data may indicate environmental conditions within the one or more food holding chambers 560. Additionally, or alternatively, the data may include data from unit controllers 562, indicating the arrangement, operating status, operating parameters, or capabilities of the food holding chambers 560. The data may include information regarding the temperature, humidity, heat source location, or other information regarding the one or more food holding chambers 560. Additionally, or alternatively, the data may indicate the position, configuration, location, or arrangement of the one or more food holding chambers 560 within the modular food holding system 500.

At block 706, the central controller 510 may determine a physical arrangement of the one or more food holding chambers 560 based upon the data received at block 704. This may include determining whether any expansion bases 540A are connected to the master base 540, as well as determining how many food holding chambers 560 are connected to each base. In some embodiments, this may further include determining configuration information for one or more of the food holding chambers 560, such as a model or serial number of the food holding chambers 560. This configuration information may also include information regarding whether the food holding chamber 560 includes a unit controller 562 or includes one or more elements disposed within the food holding chamber 560 (e.g., sensors 564, heating elements 566, fans 568, or displays 570). Several exemplary physical arrangements of the food holding chambers 560 in a modular food holding system are illustrated in FIGS. 1 and 2.

At block 708, the central controller 510 may determine additional information regarding the one or more food holding chambers 560 based upon the data received at block 704. The additional information may include the configuration information described above or other information regarding the food holding chambers 560 or their current state. Such additional information may include environmental condition information (e.g., temperature, humidity, etc.), unit content information (e.g., type or quantity of food contents, duration of operation, time elapsed since last open, time elapsed since contents placed in unit, time remaining until contents expire, etc.), operational status (e.g., powered, unpowered, operational, malfunctioning, etc.), or other information regarding the food holding chambers 560 or their contents. In some embodiments, this additional information may include operating parameters, operating status, or similar information regarding the operation of the food holding chamber 560 by the associated unit controller 562. The additional information may further be determined in part based upon additional data entered by the user, stored in the memory 516 of the central controller 510, or accessed by the central controller 510 (e.g., from a local or remote database connected via a network). In some embodiments, the additional information may include one or more control options to be presented to the user, which control options may be associated with control commands to control the actions of elements of the food holding chambers 560, as described further elsewhere herein.

At block 710, the central controller 510 may present, or cause to be presented, information regarding the modular food holding system 500 to the user. This may include presenting some or all of the arrangement information determined at block 706 and the additional information determined at block 708 regarding the one or more food holding chambers 560. For example, the information regarding the physical arrangement of the food holding chambers 560 may be presented by displaying a representation (e.g., a box or icon) of each food holding chamber 560 on the display 512, arranged to represent the physical location of each unit within the modular food holding system 500. Information regarding the operation or contents of each food holding chamber 560 may similarly be presented using icons, text, colors, shapes, or other means on the display 512. In some embodiments, the additional information may be presented in multiple screens or windows, in a drill-down fashion, using pop-up boxes, or in other configurations that allow the user to view information regarding all or only part of the modular food holding system 500. For example, the central controller 510 may present the arrangement of all the food holding chambers 560 to the user, but may present more detailed information about a particular food holding chamber 560 in a different screen upon user selection of the particular food holding chamber 560.

Figure 34:
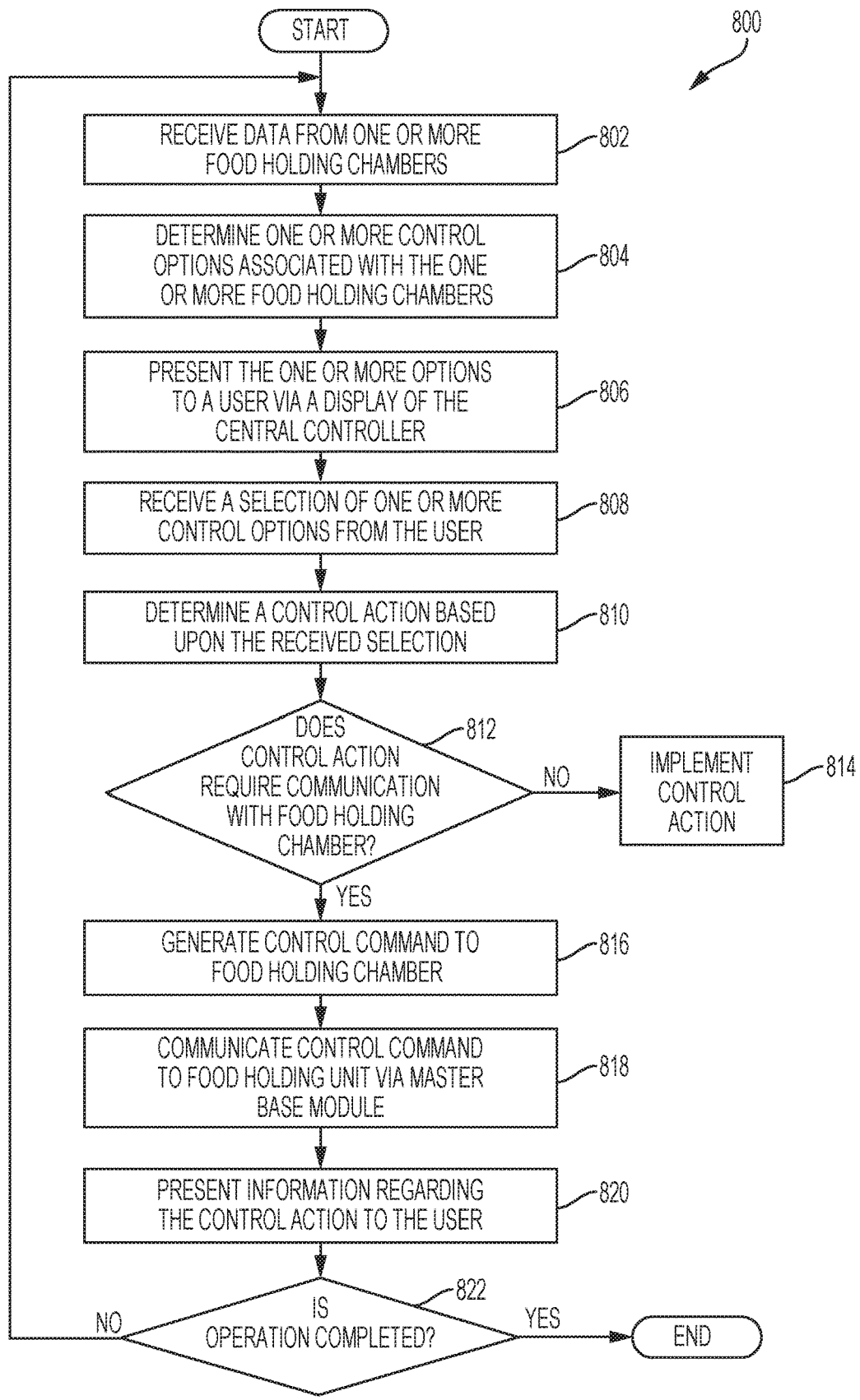
FIG. 34 is a logic flow diagram of an exemplary control method for a central controller connected to the modular food holding system of FIG. 1.

FIG. 34 illustrates a flow diagram of an exemplary control method 800 for a central controller 510 connected to a modular food holding system 500. The method 800 may be used in connection with or alternatively to method 700 discussed above, and some aspects of each may be incorporated in the other. Like the method 700, the method 800 may be implemented by a central controller 510 communicatively connected to a modular food holding system 500 via a communication link 530. The method 800 may begin at block 802 by receiving data from one or more food holding cambers 560. Based upon the received data, one or more control options may be determined at block 804 and presented to a user at block 806. Upon receiving a user selection of one or more control options at block 808, the central controller 510 may determine one or more control actions based upon the received selection at block 810. Depending upon a determination at block 812 of whether the determined control actions require communication to the food holding chambers 560, the central controller 510 may implement the control actions at block 814 or generate a control command at block 816 and transmit the control command to the food holding chambers 560 at block 818. The central controller 510 may further present, or cause to be presented, information regarding the one or more control actions to the user at block 820. The method 800 may repeat until operation of the modular food holding system 500 is determined to be complete at block 822, at which point the method 800 may terminate.

At block 802, the central controller 510 may receive data from one or more food holding chambers 560 through the master base 540 and the communicative connection over the communication link 530. In some embodiments, this may include establishing a communicative connection between the central controller 510 and the master base 540, as discussed above. In further embodiments, the central controller 510 may be incorporated within the master base 540, in which case the data may be received by the central controller 510 of the master base 540. As discussed further elsewhere herein, the data received by the central controller 510 may include data from one or more sensors 564 disposed within the food holding chambers 560, data regarding environmental conditions within the food holding chambers 560 (e.g., temperature, humidity, heat source location, ventilation, etc.), data regarding configuration of the food holding chambers 560 (e.g., elements disposed within the units, operation of the elements, arrangement of the units, etc.), operational status of the food holding chambers 560 (e.g., powered, unpowered, ready, operational, malfunctioning, etc.), operating parameters of the food holding chambers 560 (e.g., temperature, humidity, load, or duration set points), or data regarding food contents of the food holding chambers 560 (e.g., type or quantity of food contents, duration of operation, time elapsed since last open, time elapsed since contents placed in unit, time remaining until contents expire, etc.).

At block 804, the central controller 510 may determine one or more control options associated with the one or more food holding chambers 560 based upon the data received at block 802. The one or more control options may be associated with control actions that may directly or indirectly affect the operation or control of the one or more food holding chambers 560. Direct operational control may include causing an element disposed within a food holding chamber 560 to start, stop, increase, or decrease operation in order to achieve a change to environmental conditions within the food holding chamber 560. Indirect operational control may include providing or adjusting an operating parameter used by the unit controller 562 of a food holding chamber 560 to adjust environmental conditions within the food holding chamber 560. The control options may also allow the user to view or access additional information regarding some or all of the food holding chambers 560. In some embodiments, the control options may further include options to connect to or disconnect from one or more additional modular food holding systems 500, retrieve historical operating data, access troubleshooting information, send information to another user, request information from another user, or perform or schedule maintenance on the modular food holding system 500. In further embodiments, the central controller 510 may determine to present only a subset of the set of all available control options to the user, which subset may be based upon a user role or access level. Additionally, or alternatively, control options not presented may be accessible by the user through one or more menus in some embodiments.

At block 806, the central controller 510 may cause the one or more control options to be presented to the user. The one or more control options may be presented using the display 512 of the central controller 510. Additionally, or alternatively, other means of presenting the options to the user may be used in some embodiments, such as the display 570 of one or more food holding chambers 560 or other displays. In some instances, one or more of the control options may be suggested or recommended to the user, such as a control option setting a timer for a food holding chamber 560 based upon data indicating that new food content was recently placed in the food holding chamber 560. Where one or more of the determined control options is critical or time sensitive, the central controller 510 may further alert the user to the control options by also presenting an alert or alarm.

At block 808, the central controller 510 may receive a selection from the user of one or more control options. For example, the user may select an option to change a group of operating parameters associated with one or more of the food holding chambers 560 in order to adjust the environment and operations of the food holding chambers 560 to receive different food (e.g., when changing between an arrangement configured for breakfast foods and an arrangement configured for lunch foods). The selection may be received by an input device of the central controller 510. In a preferred embodiment, the input device may be combined with the display 512 as a touch screen display. Such embodiment offers the advantages of simplicity, flexibility in the input configuration, and efficient space usage. Other input devices may be used in addition to, or as alternatives to, a touch screen, including buttons, keyboards, keypads, of other known or later-developed input devices. In some embodiments, the central controller 510 may receive an indirect user selection in the form of data received from one or more food holding chambers 560. For example, the user may remove a holding bin from a food holding chamber 560, thereby indicating to the central controller 510 that food contents have been removed or discarded or that the heating elements of the food holding chamber 560 should be turned off. The user may similarly interact with a display 570, button, switch, or other element of a food holding chamber 560 to select a control option in some embodiments.

At block 810, the central controller 510 may determine one or more control actions to be taken based upon the user selection of one or more control options received at block 808. The control actions may relate to the direct or indirect control of one or more of the food holding chambers 560, as discussed herein. Some control actions may involve direct or indirect adjustments to the operation of one or more elements of a food holding chamber 560, such as controlling the speed of a fan 568 or adjusting a set point for humidity within the food holding chamber 560. Other control actions may be implemented to provide information to the user for use in operating the modular food holding system 500, such as setting a timer to alert the user when the contents of a food holding container have expired or setting an alarm to sound when a food holding chamber 560 has reached a desired temperature. The control actions may include one or more of the following: setting a timer, presenting an alert, illuminating an indicator light, displaying a countdown, presenting an option to select a type of food stored within the one or more food holding chambers 560, controlling the temperature within the one or more food holding chambers 560, controlling the humidity within the one or more food holding chambers 560, configuring operating parameters or set points of the one or more food holding chambers 560, or otherwise configuring the one or more food holding chambers 560. Thus, the determined control actions may include actions to be implemented at a food holding chamber 560 or at the central controller 510. Similarly, the determined control actions to be implemented at the food holding chamber 560 may include control actions that directly operate the components or elements disposed therein (e.g., heating elements, fans, etc.) or control actions that control the operation of the unit controller 562 disposed therein to control the components or elements (e.g., adjusting a temperature set point, setting a target humidity level, etc.).

At block 812, the central controller 510 may determine whether each control action determined at block 810 requires communication to the food holding chambers 560. For example, control actions involving configuration of the unit controller 562 or operation of a heating element 566, a fan 568, a display 570, or another element disposed within a food holding chamber 560 will require communication to the food holding chamber 560 of a control command. Control actions involving providing information, setting a timer, presenting an alert, or similar actions occurring on the central controller 510 may not require communication from the central controller 510 to any food holding chambers 560.

When the central controller 510 determines at block 812 that no communication to the food holding chambers 560 through the master base 540 is required to implement the one or more control actions, the central controller 510 may implement the one or more control actions at block 814. This may include determining additional information, presenting additional information to the user, requesting additional information from the user, or communicating with another central controller 510 or another user to assist the user in operating the modular food holding system 500. In some instances, this may include monitoring future data received at the central controller 510 from the one or more food holding modules 560 to determine when a condition is met or ceases to be met, in which case further actions may be taken by the central controller 510. Such further actions may be implemented at the central controller 510 or may require communication of control commands to one or more food holding chambers 560 at that later time.

When the central controller 510 determines at block 812 that communication to the food holding chambers 560 through the master base 540 is required to implement the one or more control actions, the central controller 510 may generate one or more control commands to one or more food holding chambers 560 at block 816. The one or more control commands may include instructions that cause a unit controller 562, sensor 564, heating element 566, fan 568, display 570, or other element disposed within a food holding chamber 560 to adjust its operation, as discussed elsewhere herein. This may include controlling one or more elements to adjust an environmental condition of the food holding chamber 560, such as temperature, humidity, ventilation, or heat source location. Control commands may also cause an alarm or information to be presented by a display, indicator light, buzzer, speaker, siren, or other notification element disposed within the food holding chamber 560.

Once the one or more control commands are determined at block 816, the central controller 510 may communicate the control commands to the one or more food holding chambers 560. As discussed above, communication may occur via the communication link 530 with the master base 540 and, through the master base 540, to the one or more food holding chambers 560. In embodiments in which a central controller 510 is incorporated within the master base 540, the communication may occur through or from such incorporated central controller 510 to the one or more food holding chambers 560. The relevant elements of the one or more food holding chambers 560 may then implement the control commands to adjust the operation of the food holding chambers 560 to which the one or more control commands are addressed or directed.

In addition to implementing the control actions at the central controller 510 or the one or more food holding chambers 560, the method 800 may include presentation of information regarding the one or more control actions to the user at block 820. As above, presentation of the information may include presentation via the display 512 of a central controller 510 or one or more displays 570 of the food holding chambers 560. The information presented to the user may include additional information regarding one or more food holding chambers 560, such as condition, status, environment, contents, or operation. The information may also assist the user in operating the modular food holding system 500, such as by presenting a countdown, a timer, instructions, recommendations, or other information regarding use or quality of the contents of the one or more food holding chambers 560. The presentation of information to the user may further server to verify receipt, communication, or implementation of the user selection of a control option.

At block 822, the method 800 may determine whether operation of the modular food holding system 500 is complete. Determining whether operation is complete may include receiving a signal indicating further operation or discontinuance of operation at the central controller 510. Such signal may be generated automatically (e.g., upon disconnection of the communicative connection with the master base 540) or may be received from the user. Determining whether operation is complete may include continuing operation until power is switched off or the power source 550 is removed. When operation is not complete, the method 800 may continue with receiving further data regarding the one or more food holding chambers 560 at block 802. When operation is determined to be complete, the method 800 may terminate. In some embodiments, a record of the operating session may be saved in the memory 816 or transmitted to a remote memory, such as a server.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in exemplary configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (code embodied on a non-transitory, tangible machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being directly or indirectly communicatively coupled through a wired or wireless communication link. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as exemplary only and does not describe every possible embodiment, as describing every possible embodiment would be impractical, if not impossible. One could implement numerous alternate embodiments, using either current technology or technology developed after the filing date of this application.

The foregoing description is for purposes of illustration only and not for purposes of limitation. The true scope of the invention is set forth by the appurtenant claims.

What is claimed:

1. A modular food holding system comprising:
   a master base configured to communicatively connect each of one or more food holding chambers to a central controller;
   a first food holding chamber having a first chamber housing, a first male upstream power and communications port that extends away from a bottom surface of the first chamber housing, a first female downstream power and communications port located into a top surface of the first chamber housing, and a plurality of first alignment structures that each comprise a post separate and spaced apart from the first male upstream power and communications port and that extend away from the bottom surface of the first chamber housing, in an engagement direction between the first male upstream power and communication port and first female downstream power and communication port, a greater distance than the first male upstream power and communications port extends away from the bottom surface of the first chamber housing; and
   a second food holding chamber connecting the master base to the first food holding chamber, the second food holding chamber having a second chamber housing and second alignment structures, the second alignment structures each comprise a hole into a top surface of the second chamber housing, the second alignment structures having a complementary shape to the first alignment structures and cooperating with the first alignment structures to align the first food holding chamber with the second food holding chamber when the first and second food holding chambers are stacked to form a food holding unit;

wherein the second food holding chamber has a second male upstream power and communications port that extends away from a bottom surface of the second chamber housing and a second female downstream power and communications port located into a top surface of the second chamber housing such that the engagement direction of the first male upstream power and communications port and the second female downstream power and communications port is parallel to an insertion direction of the first alignment structure into the second alignment structure, and wherein the first alignment structures and the second alignment structures center and stabilize the first food holding chamber on the second food holding chamber.

2. The modular food holding system of claim 1, wherein the first food holding chamber includes first securing mechanisms on the bottom surface of the first chamber housing, wherein the first alignment structures extend away from the bottom surface of the first chamber housing a greater distance than the first securing mechanisms; and wherein the second food holding chamber includes second securing mechanisms complementary to the first securing mechanisms and formed in the top surface of the second chamber housing.

3. The modular food holding system of claim 2, wherein the first alignment structures are arranged at the corners of the bottom surface of the first chamber housing.

4. The modular food holding system of claim 3, wherein the first securing mechanisms are arranged at the sides of the bottom surface of the first chamber housing and the first securing mechanisms extend in an elongated direction parallel to an adjacent side of the bottom surface, wherein at least one of the first securing mechanisms is perpendicular to another of the first securing mechanisms.

5. The modular food holding system of claim 2, wherein the first securing mechanisms are brackets and the second securing mechanisms are openings.

6. The modular food holding system of claim 1, wherein the master base is directly connected to the second food holding chamber.

7. The modular food holding system of claim 6, wherein the second food holding chamber includes a chamber alignment structure on the bottom surface of the second chamber housing, and the master base includes a base alignment structure on a top surface of a base housing, the base alignment structure cooperating with the chamber alignment structure to align the second food holding chamber with the master base when the second food holding chamber is stacked atop the master base to form a food holding unit.

8. The modular food holding system of claim 7, wherein the chamber alignment structure is a post that extends outward from the bottom surface of the second chamber housing.

9. The modular food holding system of claim 8, wherein the base alignment structure is a hole that is sized and shaped to receive the post.

10. The modular food holding system of claim 6, wherein the second food holding chamber includes a chamber securing mechanism on the bottom surface of the second chamber housing, and the master base includes a base securing structure on a top surface of the base housing.

11. The modular food holding system of claim 10, wherein the chamber securing mechanism is a bracket and the base securing mechanism is an opening that is sized and shaped to receive the bracket.

12. The modular food holding system of claim 6, further comprising an expansion base operatively connected to the master base.

13. The modular food holding system of claim 12, wherein the expansion base is operatively connected to the master base with an upstream power and communications port disposed in a side surface of an expansion base housing.

14. The modular food holding system of claim 12, wherein the expansion base includes an expansion alignment structure on a top surface of an expansion base housing, the expansion base alignment structure cooperating with a chamber alignment structure formed in a bottom surface of a third food holding chamber to align the third food holding chamber with the expansion base when the third food holding chamber is stacked atop the expansion base to form a food holding unit.

15. A modular food holding system comprising:
a master base configured to communicatively connect each of one or more food holding chambers to a central controller;
a first food holding chamber having a first chamber housing, a first female upstream power and communications port located into a bottom surface of the first chamber housing, a first male downstream power and communications port located on a top surface of the first chamber housing, and a plurality of first alignment structures, each first alignment structure of the plurality comprising a hole on the bottom surface of the first chamber housing; and
a second food holding chamber connecting the master base to the first food holding chamber, the second food holding chamber having a second chamber housing and a plurality of second alignment structures, each second alignment structure of the plurality comprising a post that extends away from a top surface of the second chamber housing, the second alignment structures having complementary shapes to the first alignment structures and cooperating with the first alignment structures to align the first food holding chamber with the second food holding chamber when the first and second food holding chambers are stacked to form a food holding unit;
wherein the second food holding chamber has a second female upstream power and communications port located into a bottom surface of the second chamber housing and a second male downstream power and communications port extending from a top surface of the second chamber housing, wherein the second alignment structures are separate and spaced apart from the second male downstream power and communications port, and the second alignment structures extend away from the top surface of the second chamber housing, in an engagement direction of the first female upstream power and communications port and the second male downstream power and communications port, a greater distance than the second male downstream power and communications port extends away from the top surface of the second chamber housing, and the engagement direction of the first upstream power and communications port and the second downstream power and communications port is parallel to an insertion direction of the second alignment structure into the first alignment structure, and
wherein the first alignment structures and the second alignment structures center and stabilize the first food holding chamber on the second food holding chamber.

16. The modular food holding system of claim 15, wherein the first food holding chamber includes first securing mechanisms formed in the bottom surface of the first chamber housing; and wherein the second food holding chamber includes second securing mechanisms complementary to the first securing mechanisms and extending from the top surface of the second chamber housing, wherein the second alignment structures extend away from the top surface of the second chamber housing a greater distance than the second securing mechanisms.

17. The modular food holding system of claim 16, wherein the first alignment structures are arranged at the corners of the bottom surface of the first chamber housing and the second alignment structures are arranged at the corners of the top surface of the second chamber housing.

18. The modular food holding system of claim 17, wherein the second securing mechanisms are arranged at the sides of the top surface of the second chamber housing and the second securing mechanisms extend in an elongated direction parallel to an adjacent side of the top surface.

19. The modular food holding system of claim 16, wherein the first securing mechanisms are openings and the second securing mechanisms are brackets.

20. The modular food holding system of claim 15, wherein the master base is directly connected to the second food holding chamber.

* * * * *